US009865518B2

(12) United States Patent
Akiba et al.

(10) Patent No.: US 9,865,518 B2
(45) Date of Patent: Jan. 9, 2018

(54) ELECTROMAGNETIC WAVE SHIELDING SUPPORT BASE-ATTACHED ENCAPSULANT, ENCAPSULATED SUBSTRATE HAVING SEMICONDUTOR DEVICES MOUNTED THEREON, ENCAPSULATED WAFER HAVING SEMICONDUCTOR DEVICES FORMED THEREON, AND SEMICONDUCTOR APPARATUS

(71) Applicant: SHIN-ETSU CHEMICAL CO., LTD., Tokyo (JP)

(72) Inventors: Hideki Akiba, Annaka (JP); Tomoaki Nakamura, Annaka (JP); Toshio Shiobara, Annaka (JP); Shinsuke Yamaguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 120 days.

(21) Appl. No.: 14/872,973

(22) Filed: Oct. 1, 2015

(65) Prior Publication Data
US 2016/0133579 A1 May 12, 2016

(30) Foreign Application Priority Data

Nov. 7, 2014 (JP) .................................. 2014-226537

(51) Int. Cl.
*H01L 23/06* (2006.01)
*H01L 23/552* (2006.01)
(Continued)

(52) U.S. Cl.
CPC ............ *H01L 23/06* (2013.01); *C09J 7/0292* (2013.01); *C09J 7/0296* (2013.01);
(Continued)

(58) Field of Classification Search
CPC ..................... H01L 23/06; H01L 23/29; H01L 2225/06537
See application file for complete search history.

(56) References Cited

U.S. PATENT DOCUMENTS

| 5,639,989 A * | 6/1997 | Higgins, III | ......... H01L 23/552 |
|---|---|---|---|
| | | | 174/386 |
| 8,728,353 B2 * | 5/2014 | Gotou | ................. H05K 9/0075 |
| | | | 174/102 R |

(Continued)

FOREIGN PATENT DOCUMENTS

| JP | H09223761 A | 8/1997 |
|---|---|---|
| JP | H10214923 A | 8/1998 |

(Continued)

OTHER PUBLICATIONS

Aug. 22, 2017 Office Action issued in Japanese Patent Application No. 2014-226537.

*Primary Examiner* — Joseph C Nicely
(74) *Attorney, Agent, or Firm* — Oliff PLC

(57) ABSTRACT

The present invention provides an electromagnetic wave shielding support base-attached encapsulant for collectively encapsulating a semiconductor device mounting surface of a substrate having semiconductor devices mounted thereon or a semiconductor device forming surface of a wafer having semiconductor devices formed thereon, the support base-attached encapsulant including a support base having an electromagnetic wave shielding property of 20 dB or more within a range of 100 MHz to 1,000 MHz, and an encapsulant composed of a thermosetting resin layer laminated on the support base. There can be provided a support base-attached encapsulant that can collectively encapsulate a semiconductor device mounting surface of a substrate having the semiconductor devices mounted thereon or a semiconductor device forming surface of a wafer having semiconductor devices formed thereon without occurrence of (Continued)

warping of the substrate or the wafer, peeling of the semiconductor devices from the substrate, and breakage of the wafer even in the case that a large-diameter wafer or a large-area substrate such as inorganic, organic, or metal substrate, especially thin one, is encapsulated, and that has excellent electromagnetic wave shielding property, reliability such as heat resistance and moisture resistance after encapsulating, and extremely high versatility, mass-productivity, workability, and economical efficiency.

20 Claims, 3 Drawing Sheets

(51) Int. Cl.
H01L 23/29 (2006.01)
H01L 23/31 (2006.01)
H01L 21/56 (2006.01)
H01L 23/00 (2006.01)
C09J 7/02 (2006.01)

(52) U.S. Cl.
CPC .......... *H01L 21/561* (2013.01); *H01L 23/29* (2013.01); *H01L 23/295* (2013.01); *H01L 23/3121* (2013.01); *H01L 23/552* (2013.01); *H01L 24/94* (2013.01); *H01L 24/97* (2013.01); *C09J 2201/61* (2013.01); *C09J 2201/622* (2013.01); *C09J 2203/326* (2013.01); *C09J 2400/163* (2013.01); *H01L 24/13* (2013.01); *H01L 24/16* (2013.01); *H01L 2224/13111* (2013.01); *H01L 2224/16227* (2013.01); *H01L 2224/97* (2013.01); *H01L 2924/0002* (2013.01); *H01L 2924/10253* (2013.01); *H01L 2924/181* (2013.01); *H01L 2924/3025* (2013.01); *H01L 2924/3511* (2013.01)

(56) References Cited

U.S. PATENT DOCUMENTS

| 2002/0043654 | A1* | 4/2002 | Karttunen | C08K 3/08 252/500 |
| 2003/0108744 | A1* | 6/2003 | Kuchler | C03C 17/23 428/403 |
| 2008/0096022 | A1* | 4/2008 | Naito | H05K 9/0096 428/409 |
| 2010/0195291 | A1 | 8/2010 | Kimura et al. | |
| 2012/0161339 | A1 | 6/2012 | Sekiguchi et al. | |
| 2012/0236528 | A1* | 9/2012 | Le | H05K 9/0088 361/818 |
| 2012/0238073 | A1* | 9/2012 | Johnson | H01L 21/3065 438/464 |
| 2013/0256717 | A1* | 10/2013 | Kimura | H01L 33/62 257/91 |
| 2015/0123251 | A1* | 5/2015 | Chiu | H01L 23/552 257/659 |
| 2015/0214077 | A1* | 7/2015 | Tsai | H01L 21/78 257/737 |
| 2015/0239197 | A1* | 8/2015 | Hosomi | H05K 9/009 428/34.1 |
| 2015/0247289 | A1* | 9/2015 | Kawaguchi | D21H 17/52 162/132 |
| 2016/0358862 | A1* | 12/2016 | Lee | H01L 23/552 |

FOREIGN PATENT DOCUMENTS

| JP | H1126651 A | 1/1999 |
| JP | 2003-273571 A | 9/2003 |
| JP | 2010-177520 A | 8/2010 |
| JP | 2012151451 A | 8/2012 |
| JP | 2013197327 A | 9/2013 |
| JP | 2014-88019 A | 5/2014 |

* cited by examiner (A) Covering step (B) Encapsulating step 11

(C) Piece forming step (D)

ELECTROMAGNETIC WAVE SHIELDING
SUPPORT BASE-ATTACHED
ENCAPSULANT, ENCAPSULATED
SUBSTRATE HAVING SEMICONDUTOR
DEVICES MOUNTED THEREON,
ENCAPSULATED WAFER HAVING
SEMICONDUCTOR DEVICES FORMED
THEREON, AND SEMICONDUCTOR
APPARATUS

BACKGROUND OF THE INVENTION

Field of the Invention

The present invention relates to an electromagnetic wave shielding support base-attached encapsulant, an encapsulated substrate having semiconductor devices mounted thereon and an encapsulated wafer having semiconductor devices formed thereon each using the encapsulant, and a semiconductor apparatus manufactured from these.

Description of the Related Art

With remarkable progress of digital technology, miniaturization and higher performance of electronic devices represented by personal computers and mobile phones have been required. For example, a printed wiring substrate, which is a representative part of these devices, has been improved toward high density mounting and miniaturization. Along with this current, an electronic device having highly integrated semiconductor parts is formed with a circuit that tends to sensitively respond to outside noise and cause malfunctions or failures. In addition, this device emits an unintended high-frequency energy outside.

As the electromagnetic wave shield that focuses on the prevention of electromagnetic noise emission to the outside of electronic/electric devices and electromagnetic noise entrance from the outside, reflective shielding materials have been conventionally used in many cases.

Accordingly, at first, electronic/electric devices had been shielded from electromagnetic noise by coating the whole housing with a conductive material or using a metal or metallic mesh cover (Patent Documents 1 to 3). After that, electromagnetic wave shielding is becoming to be applied to individual semiconductor packages. However, if the sizes of parts within the package are uneven, the sheet metal shield becomes tall because of coating the whole housing with a conductive material or using a metal or metallic mesh cover, which causes problems of occurrence of dead space and unachievable film-thinning due to the accumulation of heat, etc.

Besides, although electromagnetic wave shielding properties have been conventionally applied to individual packages, it is now required to provide electromagnetic wave shielding properties at the time of encapsulating a large-diameter wafer or a large-area substrate such as inorganic, organic, or metal substrate, in view of versatility, economical efficiency, and mass-productivity.

When a large-area substrate or a large-diameter wafer of 300 mm (12 inches) or more is encapsulated, there is a problem that the substrate or the wafer occasionally warps due to shrinkage stress of the epoxy resin or the like at the time of encapsulating and curing, and especially, the large-diameter wafer with thin thickness is liable to warp. In addition, when a semiconductor-device mounting surface of a large-area substrate having semiconductor devices mounted thereon is encapsulated, a problem arises that the semiconductor devices are peeled from the substrate by shrinkage stress of the epoxy resin or the like at the time of encapsulating and curing. Accordingly, there is a big problem that encapsulated large-area substrates and large-diameter wafers cannot be used for mass-production. Therefore, there is an attempt to encapsulate a large-diameter wafer or a large-area substrate such as organic, inorganic, or metal substrate by using a substrate-attached encapsulant in which a resin layer for use in encapsulating is formed on a substrate (Patent Documents 4 and 5).

In particular, there has been demanded a support base-attached encapsulant that can collectively encapsulate a semiconductor-device mounting surface of a substrate having the semiconductor devices mounted thereon or a semiconductor-device forming surface of a wafer having semiconductor devices formed thereon without occurrence of warping of the substrate or the wafer, peeling of the semiconductor devices from the substrate, and breakage of the wafer even in the case that thin semiconductor devices are encapsulated, and that has excellent electromagnetic wave shielding property, reliability such as heat resistance and moisture resistance after encapsulating, and extremely high versatility.

PRIOR ART REFERENCES

Patent Documents

[Patent Document 1] Japanese Patent Application Publication No. H10-214923
[Patent Document 2] Japanese Patent Application Publication No. H11-26651
[Patent Document 3] Japanese Patent Application Publication No. H9-223761
[Patent Document 4] Japanese Patent Application Publication No. 2012-151451
[Patent Document 5] Japanese Patent Application Publication No. 2013-197327

SUMMARY OF THE INVENTION

The present invention has been accomplished in view of the above-mentioned circumstances, and an object thereof is to provide a support base-attached encapsulant that can collectively encapsulate a semiconductor-device mounting surface of a substrate having the semiconductor devices mounted thereon or a semiconductor-device forming surface of a wafer having semiconductor devices formed thereon without occurrence of warping of the substrate or the wafer, peeling of the semiconductor devices from the substrate, and breakage of the wafer even in the case that a large-diameter wafer or a large-area substrate such as inorganic, organic, or metal substrate, especially thin one, is encapsulated, and that has excellent electromagnetic wave shielding property, reliability such as heat resistance and moisture resistance after encapsulating, and extremely high versatility, mass-productivity, workability, and economical efficiency.

Another object of the present invention is to provide an encapsulated substrate having semiconductor devices mounted thereon and an encapsulated wafer having semiconductor devices formed thereon, each of which is encapsulated by the support base-attached encapsulant, and further provide an electromagnetic wave shielding semiconductor apparatus obtained by dicing the encapsulated substrate having semiconductor devices mounted thereon or the encapsulated wafer having semiconductor devices formed thereon into each piece.

To achieve the objects, the present invention provides an electromagnetic wave shielding support base-attached encapsulant for collectively encapsulating a semiconductor device mounting surface of a substrate having semiconductor devices mounted thereon or a semiconductor device forming surface of a wafer having semiconductor devices formed thereon, the support base-attached encapsulant comprising a support base having an electromagnetic wave shielding property of 20 dB or more within a range of 100 MHz to 1,000 MHz, and an encapsulant composed of a thermosetting resin layer laminated on the support base.

When such an electromagnetic wave shielding support base-attached encapsulant is employed, the support base can suppress the shrinkage stress of the thermosetting resin layer at the time of encapsulating and curing, so that warping of the substrate or the wafer, peeling of the semiconductor devices from the substrate, and breakage of the wafer can be inhibited even in the case that a large-diameter wafer or a large-area substrate such as inorganic, organic, or metal substrate is encapsulated, and the semiconductor device mounting surface of the substrate having the semiconductor devices mounted thereon or the semiconductor device forming surface of the wafer having semiconductor devices formed thereon can be collectively encapsulated. In addition, the inventive support base-attached encapsulant can exhibit excellent electromagnetic wave shielding property and reliability such as heat resistance and moisture resistance after encapsulating. Further, this electromagnetic wave shielding support base-attached encapsulant is extremely excellent in versatility, mass-productivity, workability, and economical efficiency.

The support base preferably contains a resin having electromagnetic wave shielding property.

Such a support base enables the electromagnetic wave shielding support base-attached encapsulant to exhibit sufficient electromagnetic wave shielding effect.

Alternatively, it is preferred that the support base contain a resin and a fiber base, and either or both of the resin and the fiber base have electromagnetic wave shielding property.

When such a support base is used, the electromagnetic wave shielding support base-attached encapsulant can exhibit more excellent electromagnetic wave shielding property, and can inhibit occurrence of warping of the substrate or the wafer, peeling of the semiconductor devices from the substrate, and breakage of the wafer even in the case that a large-diameter wafer or a large-area substrate such as inorganic, organic, or metal substrate is encapsulated.

In addition, the support base preferably contains a layer composed of a metal.

When the support base contains the layer composed of a metal, the electromagnetic wave shielding support base-attached encapsulant has not only electromagnetic wave shielding property but also high heat resistance.

Further, the present invention provides an encapsulated substrate having semiconductor devices mounted thereon, obtained by covering a semiconductor device mounting surface of a substrate having semiconductor devices mounted thereon with the thermosetting resin layer of the above-mentioned electromagnetic wave shielding support base-attached encapsulant, and heating and curing the thermosetting resin layer to collectively encapsulate the semiconductor device mounting surface by the electromagnetic wave shielding support base-attached encapsulant.

Such an encapsulated substrate having semiconductor devices mounted thereon has electromagnetic wave shielding property, and in the encapsulated substrate, occurrence of warping and peeling of the semiconductor devices are inhibited.

Further, the present invention provides an encapsulated wafer having semiconductor devices formed thereon, obtained by covering a semiconductor device forming surface of a wafer having semiconductor devices formed thereon with the thermosetting resin layer of the above-mentioned electromagnetic wave shielding support base-attached encapsulant, and heating and curing the thermosetting resin layer to collectively encapsulate the semiconductor device forming surface by the electromagnetic wave shielding support base-attached encapsulant.

Such an encapsulated wafer having semiconductor devices formed thereon has electromagnetic wave shielding property, and in the encapsulated wafer, occurrence of warping and breakage are inhibited.

Further, the present invention provides a semiconductor apparatus obtained by dicing the encapsulated substrate having semiconductor devices mounted thereon or the encapsulated wafer having semiconductor devices formed thereon into each piece.

Such a semiconductor apparatus is high quality and has electromagnetic wave shielding property.

As mentioned above, according to the electromagnetic wave shielding support base-attached encapsulant of the present invention, the support base can suppress the shrinkage stress of the thermosetting resin layer at the time of encapsulating and curing, so that warping of the substrate or the wafer, peeling of the semiconductor devices from the substrate, and breakage of the wafer can be inhibited even in the case that a large-diameter wafer or a large-area substrate such as inorganic, organic, or metal substrate is encapsulated, and the semiconductor device mounting surface of the substrate having the semiconductor devices mounted thereon or the semiconductor device forming surface of the wafer having semiconductor devices formed thereon can be collectively encapsulated. In addition, the inventive support base-attached encapsulant can exhibit excellent electromagnetic wave shielding property and reliability such as heat resistance and moisture resistance after encapsulating. Further, this electromagnetic wave shielding support base-attached encapsulant is extremely excellent in versatility, mass-productivity, workability, and economical efficiency.

Moreover, in the encapsulated substrate having semiconductor devices mounted thereon and the encapsulated wafer having semiconductor devices formed thereon, which have been encapsulated by the electromagnetic wave shielding support base-attached encapsulant, warping of the substrate or the wafer, peeling of the semiconductor devices from the substrate, and breakage of the wafer are inhibited. Further, the semiconductor apparatus obtained by dicing into each piece the encapsulated substrate having semiconductor devices mounted thereon or the encapsulated wafer having semiconductor devices formed thereon, which has been encapsulated with the electromagnetic wave shielding support base-attached encapsulant excellent in reliability such as heat resistance and moisture resistance and inhibited from warping, is high quality.

DETAILED DESCRIPTION OF THE PREFERRED EMBODIMENTS

Figure 1:
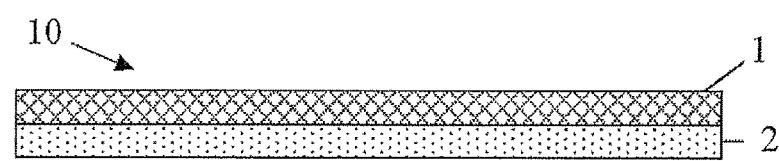
FIG. 1 shows an exemplary cross-sectional view of the electromagnetic wave shielding support base-attached encapsulant of the present invention.

Hereinafter, the electromagnetic wave shielding support base-attached encapsulant of the present invention, the encapsulated substrate having semiconductor devices mounted thereon and the encapsulated wafer having semiconductor devices formed thereon each obtained by being encapsulated with the electromagnetic wave shielding support base-attached encapsulant, and the semiconductor apparatus obtained by dicing the encapsulated substrate having semiconductor devices mounted thereon or the encapsulated wafer having semiconductor devices formed thereon into each piece will be described in detail, but the present invention is not limited thereto.

As described above, there has been demanded a support base-attached encapsulant that can collectively encapsulate a semiconductor device mounting surface of a substrate having the semiconductor devices mounted thereon or a semiconductor device forming surface of a wafer having semiconductor devices formed thereon without occurrence of warping of the substrate or the wafer, peeling of the semiconductor devices from the substrate, and breakage of the wafer even in the case that a large-area substrate having semiconductor devices mounted thereon, such as inorganic, organic, or metal substrate, or a large-diameter wafer having semiconductor devices formed thereon is encapsulated, and that has excellent electromagnetic wave shielding property, reliability such as heat resistance and moisture resistance after encapsulating, and extremely high versatility, mass-productivity, workability, and economical efficiency.

The present inventors have diligently studied to accomplish the objects and consequently found that a support base-attached encapsulant that includes a support base having an electromagnetic wave shielding property of a specific value or more and a resin layer composed of a thermosetting resin formed on one side of the support base has excellent electromagnetic wave shielding property, and can suppress shrinkage stress of the resin layer at the time of curing since the difference in expansion coefficient between the substrate having semiconductor devices mounted thereon or the wafer having semiconductor devices formed thereon and the support base in the present invention is small. By this effect of suppressing the shrinkage stress, warping of the substrate or the wafer can be reduced, and the objects such as collectively encapsulating and keeping excellent reliability can be accomplished.

In addition, the present inventors found that warping of the substrate or the wafer and peeling of the semiconductor devices from the substrate can be inhibited by the effect of suppressing the shrinkage stress even when a large-diameter wafer or a large-area substrate such as inorganic, organic, and metal substrate is encapsulated. Further, they found that when the electromagnetic wave shielding support base-attached encapsulant of the present invention is used, the semiconductor device mounting surface of the substrate having semiconductor devices mounted thereon or the semiconductor device forming surface of the wafer having semiconductor devices formed thereon can be collectively encapsulated, and after encapsulating, it exhibits excellent reliability such as heat resistance, electrical insulation property, light resistance, and moisture resistance, and extremely excellent versatility, productivity such as dimensional stability and printability, and economical efficiency. From the above findings, they brought the electromagnetic wave shielding support base-attached encapsulant of the present invention to completion.

Also, the present inventors found that in the encapsulated substrate having semiconductor devices mounted thereon and the encapsulated wafer having semiconductor devices formed thereon each obtained by being collectively encapsulated with the electromagnetic wave shielding support base-attached encapsulant of the present invention, warping of the substrate or the wafer, peeling of the semiconductor devices from the substrate, and breakage of the wafer can be inhibited. Further, they found that a high-quality semiconductor apparatus having electromagnetic wave shielding property can be obtained by dicing into each piece such an encapsulated substrate having semiconductor devices mounted thereon or an encapsulated wafer having semiconductor devices formed thereon, which are inhibited from warping, peeling of the semiconductor devices, and breakage. From these findings, they brought the encapsulated substrate having semiconductor devices mounted thereon, the encapsulated wafer having semiconductor devices formed thereon, and the semiconductor apparatus of the present invention to completion.

That is, the present invention is an electromagnetic wave shielding support base-attached encapsulant for collectively encapsulating a semiconductor device mounting surface of a substrate having semiconductor devices mounted thereon or a semiconductor device forming surface of a wafer having semiconductor devices formed thereon, the support base-attached encapsulant comprising a support base having an electromagnetic wave shielding property of 20 dB or more, preferably 30 dB or more, within a range of 100 MHz to 1,000 MHz, and an encapsulant composed of a thermosetting resin layer laminated on the support base.

Hereinafter, the support base and the thermosetting resin layer of the support base-attached encapsulant of the present invention will be described.

<Electromagnetic Wave Shielding Property>

The electromagnetic wave shielding property of the support base used in the electromagnetic wave shielding support base-attached encapsulant of the present invention is 20 dB or more within a range of 100 MHz to 1,000 MHz. The test is conducted by the following measuring method. Measuring method: KEC method (KEC: Kansai Electronic Industry Development Center)

Measuring Conditions:
Measuring frequency: 100 MHz to 1,000 MHz
Distance between transmitting part and receiving part: 10 mm
Temperature and humidity in test room: 20° C./65% RH When the electromagnetic wave shielding property of the support base used in the support base-attached encapsulant is less than 20 dB, the electromagnetic wave shielding support base-attached encapsulant having sufficient electromagnetic wave shielding property, which is the object of the present invention, cannot be obtained.

<Support Base>

The support base of the electromagnetic wave shielding support base-attached encapsulant of the present invention has electromagnetic wave shielding property. As the support base having electromagnetic wave shielding property, there may be mentioned materials that contain a resin having electromagnetic wave shielding property, materials that contain a resin and a fiber base either or both of which have a electromagnetic wave shielding property, materials that contain a layer composed of metal, and combinations thereof, as shown below.

1. Support Base that Contains a Resin Having Electromagnetic Wave Shielding Property

[Resin Having Electromagnetic Wave Shielding Property]

The support base of the electromagnetic wave shielding support base-attached encapsulant of the present invention may be a material that contains a resin having electromagnetic wave shielding property. The resin having electromagnetic wave shielding property contains a filler that provides electromagnetic wave shielding property to the thermosetting resin, and examples of a conductive filler include powders such as Au, Ag, Ni, Cu, stainless steel, carbon black, graphite, titanium oxide-tin oxide type, conductive zinc oxide, Au—Ag composite type powder, Ni—Ag composite type powder, Ag-coated glass bead, and carbon balloon; flaky metals such as stainless steel flake, nickel flake, and aluminum flake; and chopped fibers of conductive fibers such as carbon fiber, aluminum ribbon, aluminum-coated glass fiber, and metal fiber. Examples of a magnetically permeable filler include alloys such as permalloy, Mu-metal, Mo-permalloy, supermalloy, and sendust, ferrite powders such as Mn—Zn type powder, Ni—Zn type powder, and flat Fe—Al—Si alloy powder.

In particular, materials containing a conductive filler such as carbon black, milled fiber of carbon fiber, Ag-coated glass bead, and Au-coated Cu are preferred.

The blending amounts of the conductive filler and the magnetically permeable filler are preferably 1 to 2,000 parts by mass, more preferably 10 to 1,500 parts by mass, based on 100 parts by mass of the thermosetting resin.

The conductive chopped-fiber filler exhibits the effect with a small amount, but if the blending amount is 10 parts by mass or more, sufficient electromagnetic wave shielding property can be obtained in view of workability and uniform dispersion. If the blending amount is less than 2,000 parts by mass, the viscosity of the thermosetting resin containing the conductive filler and the magnetically permeable filler does not become too high, and thus flowability is sufficient. Therefore, a uniform and homogenous support base with sufficient strength can be obtained.

For the purpose of providing reinforcement, heat conductivity, low expansion coefficient, thixotropy, etc., an inorganic filler besides the conductive filler may be blended into the thermosetting resin. Examples of the inorganic filler to be blended include silica such as fused silica and crystalline silica, alumina, silicon nitride, aluminum nitride, aluminosilicate, boron nitride, glass fiber, and antimony trioxide. Average particle size and shape of these inorganic fillers are not particularly limited.

Examples of the thermosetting resin of the support base include an epoxy resin, a silicone resin, a hybrid resin of an epoxy resin and a silicone resin, and a cyanate ester resin, as shown below. There is no specific limitation on the resin so long as it is a thermosetting resin generally used for encapsulating semiconductor devices.

The detail is described below.

[Epoxy Resin]

The epoxy resin may be, but not particularly limited to, a bisphenol type epoxy resin such as a bisphenol A type epoxy resin and a bisphenol F type epoxy resin; a biphenol type epoxy resin such as a 3,3',5,5'-tetramethyl-4,4'-biphenol type epoxy resin and a 4,4'-biphenol type epoxy resin; a novolac type epoxy resin such as a phenol novolac type epoxy resin, a cresol novolac type epoxy resin, and a bisphenol A novolac type epoxy resin; an epoxy resin in which an aromatic ring of a naphthalenediol type epoxy resin, a trisphenylolmethane type epoxy resin, a tetrakisphenylolethane type epoxy resin, or a phenoldicyclopentadiene novolac type epoxy resin has been hydrogenated; and a known epoxy resin which is solid or liquid at room temperature (25° C.) such as an alicyclic epoxy resin, etc. An epoxy resin other than the above may be used together with a certain amount, if necessary.

In the epoxy resin, a curing agent for epoxy resin may be contained. Examples of a usable curing agent include phenol resins such as phenol novolac resins, various kinds of amine derivatives, acid anhydrides, and those in which an acid anhydride group is partially ring-opened to form a carboxylic acid. Above all, a phenol novolac resin is desired to ensure the reliability of a semiconductor apparatus manufactured by using an encapsulated substrate having semiconductor devices mounted thereon obtained by being collectively encapsulated with the electromagnetic wave shielding support base-attached encapsulant of the present invention. It is particularly preferred that an epoxy resin and a phenol novolac resin be mixed such that the ratio of the epoxy group to the phenolic hydroxyl group is 1:0.8 to 1:1.3.

In addition, imidazole derivatives, phosphine derivatives, amine derivatives, a metal compound such as an organic aluminum compound, etc., may be used as a reaction promoter to promote the reaction of the epoxy resin and the curing agent.

The thermosetting resin composed of an epoxy resin may further contain various kinds of additives, if necessary. For example, for the purpose of improving the properties of the resin, various kinds of thermoplastic resins, thermoplastic elastomers, organic synthetic rubbers, stress lowering agents of silicone type or other type, waxes, and additives such as a halogen-trapping agent, etc., may be added depending on the purpose.

As the inorganic filler to be blended to the thermosetting resin composed of the epoxy resin, a filler previously subjected to surface treatment with a coupling agent such as a silane coupling agent and a titanate coupling agent may be blended to increase bonding strength of the epoxy resin and the inorganic filler.

Preferable examples of the coupling agent include epoxy functional alkoxysilanes such as γ-glycidoxypropyltrimethoxysilane, γ-glycidoxypropylmethyldiethoxysilane, and β-(3,4-epoxycyclohexyl)ethyltrimethoxysilane; amino functional alkoxysilanes such as N-β-(aminoethyl)-γ-aminopropyltrimethoxysilane, γ-aminopropyltriethoxysilane, and N-phenyl-γ-aminopropyltrimethoxysilane; and mercapto functional alkoxysilanes such as γ-mercaptopropyltrimethoxysilane. Incidentally, the blending amount of the coupling agent to be used for the surface treatment and a method of the surface treatment are not particularly limited.

[Silicone Resin]

As to the silicone resin, a thermosetting silicone resin, etc., are usable. In particular, an addition curable silicone resin composition is desirable. The addition curable silicone resin composition particularly preferred is a composition including (A) an organosilicon compound having a nonconjugated double bond, (B) an organohydrogenpolysiloxane, and (C) a platinum-based catalyst as essential components. These components of (A) to (C) will be described below.

Component (A): Organosilicon Compound Having Nonconjugated Double Bond

The organosilicon compound having nonconjugated double bond acts as a base polymer (main component) of the silicone resin composition. Examples of the component (A) include an organopolysiloxane represented by the general formula (1):

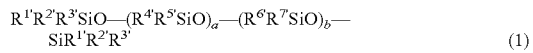

wherein $R^{1'}$ represents a monovalent hydrocarbon group containing a nonconjugated double bond, $R^{2'}$ to $R^{7'}$ each represent an identical or different monovalent hydrocarbon group, and "a" and "b" are each an integer satisfying $0 \leq a \leq 500$, $0 \leq b \leq 250$, and $0 \leq a+b \leq 500$.

In the general formula (1), $R^{1'}$ is a monovalent hydrocarbon group containing a nonconjugated double bond, and preferably a monovalent hydrocarbon group containing a nonconjugated double bond having an aliphatic unsaturated bond as typified by an alkenyl group preferably having 2 to 8 carbon atoms, particularly preferably 2 to 6 carbon atoms.

In the general formula (1), $R^{2'}$ to $R^{7'}$ are each an identical or different monovalent hydrocarbon group; examples thereof include an alkyl group, an alkenyl group, an aryl group, and an aralkyl group each preferably having 1 to 20 carbon atoms, particularly preferably 1 to 10 carbon atoms. Among these, more preferable examples of $R^{4'}$ to $R^{7'}$ include a monovalent hydrocarbon group having no aliphatic unsaturated bond; particularly preferably an alkyl group, an aryl group, or aralkyl group, which do not have an aliphatic unsaturated bond unlike an alkenyl group. Among these, $R^{6'}$ and $R^{7'}$ are preferably an aromatic monovalent hydrocarbon group, particularly preferably an aryl group having 6 to 12 carbon atoms, such as a phenyl group and a tolyl group.

In the general formula (1), "a" and "b" are each preferably an integer satisfying $0 \leq a \leq 500$, $0 \leq b \leq 250$, and $0 \leq a+b \leq 500$; "a" is more preferably $10 \leq a \leq 500$, particularly preferably $10 \leq a \leq 250$; "b" is more preferably $0 \leq b \leq 150$, particularly preferably $0 \leq b \leq 100$; and a+b more preferably satisfies $10 \leq a+b \leq 500$, particularly preferably $10 \leq a+b \leq 250$.

The organopolysiloxane represented by the general formula (1) can be obtained, for example, by an alkali equilibration reaction between a cyclic diorgano-polysiloxane such as cyclic diphenylpolysiloxane or cyclic methylphenylpolysiloxane and a disiloxane such as diphenyltetravinyldisiloxane or divinyltetraphenyl-disiloxane to constitute a terminal group. In this case, since, in an equilibration reaction by an alkali catalyst (particularly a strong alkali such as KOH), polymerization proceeds with a small amount of the catalyst by an irreversible reaction; thereby a ring-opening polymerization alone proceeds quantitatively and a terminal blocking ratio becomes high. Therefore, a silanol group and a chlorine content are generally not contained.

The organopolysiloxane represented by the general formula (1) may be exemplified by the following.

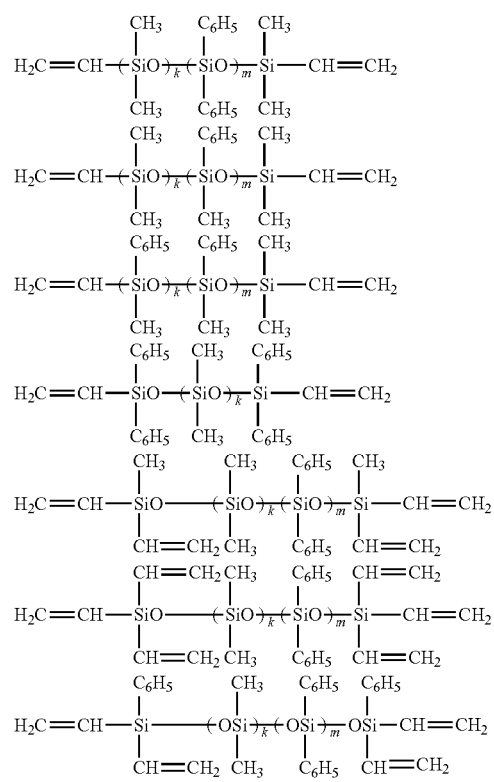

wherein "k" and "m" are each preferably an integer satisfying $0 \leq k \leq 500$, $0 \leq m \leq 250$, and $0 \leq k+m \leq 500$, more preferably an integer satisfying $5 \leq k+m \leq 250$ and $0 \leq m/(k+m) \leq 0.5$.

The organopolysiloxane having a linear structure represented by the general formula (1) may be used as the component (A) in combination with an organopolysiloxane having a three-dimensional network structure including a trifunctional siloxane unit, a tetrafunctional siloxane unit, etc., if needed. The silicon compound having a nonconjugated double bond may be used alone or in combination of two or more kinds.

The amount of the group having a nonconjugated double bond (the monovalent hydrocarbon group having a double bond and bonded to a Si atom) in the silicon compound having a nonconjugated double bond, is preferably 1 to 50 mol % of the total amount of the monovalent hydrocarbon group (the total amount of the monovalent hydrocarbon group bonded to a Si atom), more preferably 2 to 40 mol %, particularly preferably 5 to 30 mol %. The reason why these amounts are preferable is that if the amount of the group having a nonconjugated double bond is 1 mol % or more, a good cured product can be obtained when it is cured, and if it is 50 mol % or less, the mechanical properties of a cured product become good.

In addition, the silicon compound having a nonconjugated double bond preferably contains an aromatic monovalent hydrocarbon group (an aromatic monovalent hydrocarbon group bonded to a Si atom); the content of the aromatic monovalent hydrocarbon group is preferably 0 to 95 mol % of the total amount of the monovalent hydrocarbon group (the total amount of the monovalent hydrocarbon group bonded to a Si atom), more preferably 10 to 90 mol %, particularly preferably 20 to 80 mol %. When the aromatic monovalent hydrocarbon group is contained in the resin with a suitable amount, there are merits that mechanical properties when it is cured are good and producing thereof is easy.

Component (B): Organohydrogenpolysiloxane

The component (B) is preferably an organohydrogenpolysiloxane having two or more hydrogen atoms bonded to silicon atoms (SiH group) per molecule. The organohydrogenpolysiloxane having two or more hydrogen atoms bonded to silicon atoms (SiH group) per molecule functions as a crosslinker and enables the formation of a cured product by addition reaction between the SiH group in component (B) and the group having a nonconjugated double bond, such as a vinyl group or an alkenyl group, in component (A).

The organohydrogenpolysiloxane, component (B), preferably has an aromatic monovalent hydrocarbon group. If the organohydrogenpolysiloxane has an aromatic monovalent hydrocarbon group, compatibility with the component (A) can be increased. The organohydrogenpolysiloxane may be used alone or in combination of two or more kinds. For example, the organohydrogenpolysiloxane having an aromatic hydrocarbon group may be contained as a part of the component (B) or used as the component (B).

Examples of the component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxane having both molecular terminals blocked with trimethylsiloxy groups, a dimethylsiloxane/methylhydrogensiloxane copolymer having both molecular terminals blocked with trimethylsiloxy groups, dimethylpolysiloxane having both molecular terminals blocked with dimethylhydrogensiloxy groups, a dimethylsiloxane/methylhydrogensiloxane copolymer having both molecular terminals blocked with dimethylhydrogensiloxy groups, a methylhydrogensiloxane/diphenylsiloxane copolymer having both molecular terminals blocked with trimethylsiloxy groups, a methylhydrogensiloxane/diphenylsiloxane/dimethylsiloxane copolymer having both molecular terminals blocked with trimethylsiloxy groups, a trimethoxysilane polymer, a copolymer of $(CH_3)_2HSiO_{1/2}$ units and $SiO_{4/2}$ units, and a copolymer of $(CH_3)_2HSiO_{1/2}$ units, $SiO_{4/2}$ units, and $(C_6H_5)SiO_{3/2}$ units, but it is not limited thereto.

In addition, an organohydrogenpolysiloxane obtained by using the units represented by the following structures may also be used.

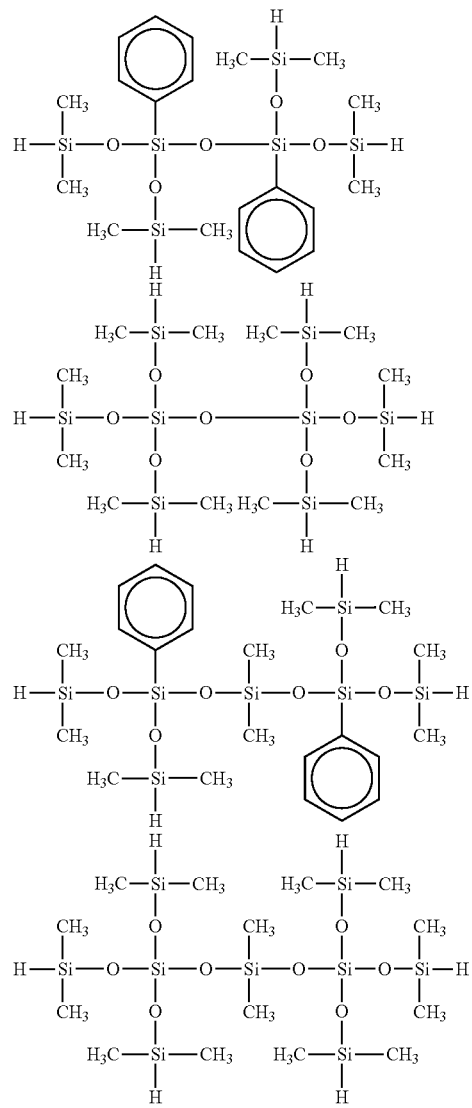

The molecular structure of the organohydrogenpolysiloxane, component (B), may be any of a linear, cyclic, branched, or three-dimensional network structure, and the number of silicon atoms in one molecule (or a polymerization degree in case of a polymer) is preferably 2 or more, more preferably 2 to 1,000, particularly preferably 2 to 300 approximately.

The organohydrogenpolysiloxane, component (B), is preferably contained such that the number of hydrogen atoms bonded to silicon atoms (SiH group) in component (B) is 0.7 to 3.0 per one group having a nonconjugated double bond, such as an alkenyl group, in component (A).

Component (C): Platinum-Based Catalyst

As to the component (C), a platinum-based catalyst is used. Examples of the platinum-based catalyst include a chloroplatinic acid, an alcohol-modified chloroplatinic acid, a platinum complex having a chelate structure. These may be used alone or in combination of two or more kinds.

The amount of the component (C) may be an effective amount for curing, or a so-called catalytic amount. A preferable amount thereof is generally 0.1 to 500 ppm in terms of a mass of the platinum group metal per a total amount of 100 parts by mass of the component (A) and the component (B), and the range of 0.5 to 100 ppm is particularly preferable.

Also in the case that an inorganic filler is blended to the silicone resin composition, the inorganic filler to be blended may be previously subjected to surface treatment with the above-mentioned coupling agent.

The blending amount of the inorganic filler is not particularly limited so long as the amount is sufficient to consequently obtain the support base of the support base-attached encapsulant for encapsulating semiconductor devices formed on a wafer or semiconductor devices arranged and mounted on a substrate, in the electromagnetic wave shielding support base-attached encapsulant which is the object of the present invention.

[Hybrid Resin of Epoxy Resin and Silicone Resin]

Examples of the epoxy resin and the silicone resin used in the hybrid resin include the above-mentioned epoxy resin and the above-mentioned silicone resin.

[Cyanate Ester Resin]

As to the cyanate ester resin, a resin composition containing (A') a cyanate ester compound or an oligomer thereof and (B') a phenol compound and/or a dihydroxynaphthalene compound, with a content of 0.05 to 0.4 mol of the hydroxyl group in the component (B') per 1 mol of the cyanate group in the component (A'). Hereinafter, the components (A') and (B') will be described.

[Component (A')]

(Cyanate Ester Compound or Oligomer Thereof)

As the component (A') in the cyanate ester resin used in the present invention, the cyanate ester compound represented by the general formula (2) or an oligomer thereof can be preferably used.

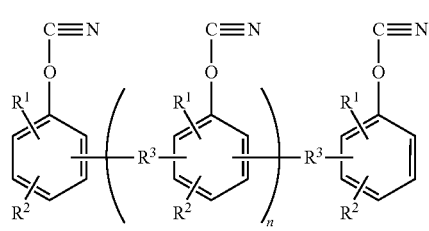

(2)

wherein $R^1$ and $R^2$ each represent a hydrogen atom or an alkyl group having 1 to 4 carbon atoms; $R^3$ is represented by any one of:

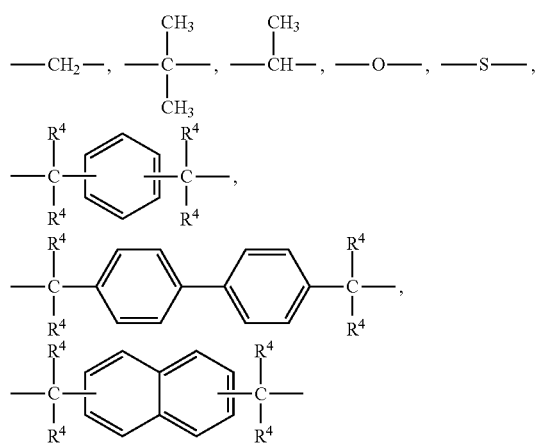

"n" is an integer of 0 to 30; and $R^4$ represents a hydrogen atom or a methyl group.

This cyanate ester compound is a compound having two or more cyanate groups per molecule, and illustrative examples thereof include a cyanic acid ester of a polycyclic aromatic divalent phenol such as bis(3,5-dimethyl-4-cyanatephenyl)methane, bis(4-cyanatephenyl)methane, bis(3-methyl-4-cyanatephenyl)-methane, bis(3-ethyl-4-cyanatephenyl)methane, bis(4-cyanatephenyl)-1,1-ethane, bis(4-cyanatephenyl)-2,2-propane, di(4-cyanatephenyl) ether, and di(4-cyanatephenyl)thioether; a polycyanic acid ester of a polyvalent phenol such as a phenol novolac type cyanate ester, a cresol novolac type cyanate ester, a phenylaralkyl type cyanate ester, a biphenylaralkyl type cyanate ester, and a naphthalenearalkyl type cyanate ester.

The above-mentioned cyanate ester compound can be obtained by reaction between phenols and cyanogen chloride under basic conditions. The cyanate ester compound may be selected properly depending on the use from the wide range of materials with characteristics varied due to its structure from a solid state having a softening point of 106° C. to a liquid state at room temperature.

Among them, a cyanate ester compound having a small cyanate equivalent, i.e., a small amount of molecular weight between functional groups exhibits a slight curing shrinkage, enabling a cured product having low thermal expansion and high glass transition temperature to be obtained. Meanwhile a cyanate ester compound having a large cyanate equivalent exhibits a slightly reduced glass transition temperature but increases the flexibility of a triazine cross-linking distance, enabling reduction in elasticity, increase in toughness, and reduction in water absorbability to be expected.

Chlorine bonded to or remained in the cyanate ester compound is preferably 50 ppm or less, more preferably 20 ppm or less. It is preferably 50 ppm or less, because there is no possibility that chlorine or chlorine ions, liberated by thermal decomposition when being stored at a high temperature for a long period of time, corrode an oxidized Cu frame, Cu wire or Ag plating, thereby causing exfoliation or electric failure, and reduction in insulation property of the resin can be prevented.

[Component (B')]

The cyanate ester resin used in the present invention preferably contains component (B') as a curing agent. Generally, as a curing agent and a curing catalyst of a cyanate ester compound, a metal salt, a metal complex, or a phenolic hydroxyl group or a primary amine each having an active hydrogen is used. In the present invention, a phenol compound or a dihydroxynaphthalene compound is preferably used.

(Phenol Compound)

As the component (B'), a phenol compound having two or more hydroxyl groups per molecule, as represented by the general formula (3), can be preferably used,

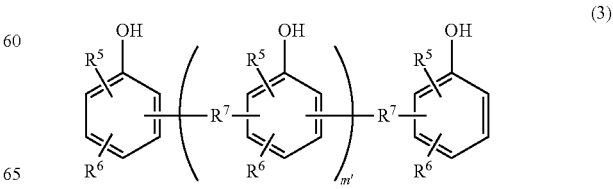

(3)

wherein $R^5$ and $R^6$ each represent a hydrogen atom or an alkyl group having 1 to 4 carbon atoms; $R^7$ is represented by any one of:

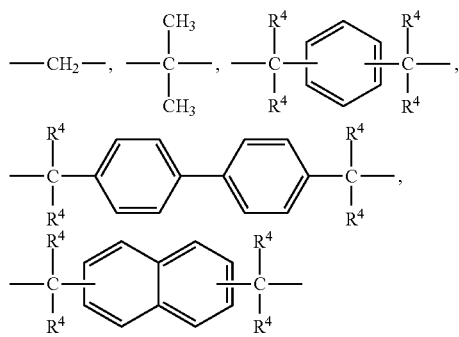

m' is an integer of 0 to 30; and $R^4$ represents a hydrogen atom or a methyl group.

Examples of the phenol compound include a phenol resin having two or more phenolic hydroxyl groups per molecule, a bisphenol F type resin, a bisphenol A type resin, a phenol novolac resin, a phenolaralkyl type resin, a biphenylaralkyl type resin, and a naphthalenearalkyl type resin; these may be used alone or in combination of two or more kinds.

Among the phenol compound, those having a small phenolic hydroxyl equivalent, for example, a hydroxyl equivalent of 120 or less, has high reactivity with a cyanate group, and therefore the curing reaction proceeds at a low temperature of 120° C. or lower. In this case, it is preferable to reduce the molar ratio of the hydroxyl group to the cyanate group. This ratio is preferably in the range of 0.05 to 0.11 mol per 1 mol of the cyanate group. In this case, a cured product exhibiting a slight curing shrinkage, a low thermal expansion, and high glass transition temperature can be obtained.

In contrast, a phenol compound having a large phenolic hydroxyl equivalent, for example, a hydroxyl equivalent of 175 or more, has an inhibited reactivity with a cyanate group, and therefore a composition having good preservability and good flowability can be obtained. The ratio is preferably in the range of 0.1 to 0.4 mol per 1 mol of the cyanate group. In this case, a cured product having low water absorption but a slightly reduced glass transition temperature can be obtained. These phenol resins may be used in combination of two or more kinds to obtain desired characteristics and curability of the cured product.

(Dihydroxynaphthalene Compound)

As the component (B'), a dihydroxynaphthalene compound represented by the formula (4), can also be preferably used.

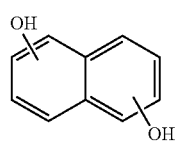

(4)

Examples of the dihydroxynaphthalene compound include 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 2,6-dihydroxynaphthalene, 2,7-dihydroxynaphthalene. 1,2-dihydroxynaphthalene, 1,3-dihydroxynaphthalene, and 1,6-dihydroxynaphthalene, each of which has a melting point of 130° C., have very high reactivity and promote cyclization reaction of the cyanate group with a small amount. 1,5-dihydroxynaphthalene and 2,6-dihydroxynaphthalene, each of which has a melting point of 200° C. or higher, relatively suppress the reaction.

Use of the dihydroxynaphthalene compound alone makes the molecular weight between functional groups small and the structure rigid, thereby enabling a cured product having a slight curing shrinkage and high glass transition temperature to be obtained. In addition, use of the dihydroxynaphthalene compound in combination with a phenol compound that has two or more hydroxyl groups per molecule and has a large hydroxyl equivalent enables the curability to be adjusted.

A halogen element and an alkali metal in the phenol compound and the dihydroxynaphthalene compound are preferably 10 ppm or less, particularly preferably 5 ppm or less when the sample is extracted at 120° C. under 2 atm.

The cyanate ester resin used in the present invention preferably contains either or both of the phenol compound and the dihydroxynaphthalene compound mentioned above as the component (B').

2. Support Base that Contains a Resin and a Fiber Base Either or Both of which have Electromagnetic Wave Shielding Property The support base of the electromagnetic wave shielding support base-attached encapsulant of the present invention may be a material that contains a thermosetting resin and a fiber base either or both of which have electromagnetic wave shielding property. As this support base, there may be mentioned combinations of a resin having or not having electromagnetic wave shielding property and a fiber base having or not having electromagnetic wave shielding property, as shown below.

I) Resin not Having Electromagnetic Wave Shielding Property

Examples of the resin not having electromagnetic wave shielding property include the above-mentioned epoxy resin, silicone resin, hybrid resin of an epoxy resin and silicone resin, and cyanate ester resin. There is no specific limitation on the resin so long as it is a thermosetting resin generally used for encapsulating semiconductor devices.

II) Resin Having Electromagnetic Wave Shielding Property

Examples of the resin having electromagnetic wave shielding property include the above-mentioned epoxy resin, silicone resin, hybrid resin of an epoxy resin and silicone resin, and cyanate ester resin each containing the above-mentioned filler that provides electromagnetic wave shielding property.

III) Fiber Base

Exemplary materials that can be used for the fiber base include inorganic fibers such as carbon fiber, glass fiber, quartz glass fiber, and metal fiber; organic fibers such as aromatic polyamide fiber, polyimide fiber, and polyamideimide fiber; silicon carbide fiber; titanium carbide fiber; boron fiber; alumina fiber; and any other materials depending on the product properties. The most preferred fiber base is a conductive fiber base because of the advantage in manufacturing the support base having electromagnetic wave shielding property.

Conformations of the fiber base are exemplified by a sheet type such as roving obtained by pulling and aligning long fiber filaments in a fixed direction, fiber cloth, nonwoven cloth, a chopped strand mat, and others, but they are not particularly limited so long as a laminated body can be formed.

In addition, the support base may be obtained, for example, by subjecting the fiber base to surface treatment with an organic compound containing silicon atoms (hereinafter, referred to as an organosilicon compound) and then thermally curing the treated fiber base.

Examples of the organosilicon compound include one or more compounds selected from the group consisting of alkoxysilane, polysilazane, partial hydrolysis condensates thereof, and a silicone-modified varnish.

Examples of the alkoxysilane include tetraalkoxysilanes such as tetramethoxysilane and tetraethoxysilane; alkylalkoxysilanes such as trimethylmethoxysilane, trimethylethoxysilane, dimethyldimethoxysilane, dimethyldiethoxysilane, methyltrimethoxysilane, methyltriethoxysilane, n-propyltriethoxysilane, hexyltrimethoxysilane, octyltriethoxysilane, decyltrimethoxysilane, and 1,6-bis(trimethoxysilyl)hexane; arylalkoxysilanes such as methylphenyldimethoxysilane, methylphenyldiethoxysilane, diphenyldimethoxysilane, diphenyldiethoxysilane, phenyltrimethoxysilane, phenyltriethoxysilane, p-styryltrimethoxysilane; hydroxyalkoxysilanes such as hydroxytrimethoxysilane and hydroxytriethoxysilane; alkenylalkoxysilanes such as vinyltrimethoxysilane and vinyltriethoxysilane; epoxy group-containing alkoxysilanes, such as 3-glycidoxypropyltrimethoxysilane, 3-glycidoxypropylmethyldimethoxysilane, 3-glycidoxypropyl-triethoxysilane, 3-glycidoxypropylmethyldiethoxysilane, and 2-(3,4-epoxycyclohexyl)ethyltrimethoxysilane; (meth)acrylic group-containing alkoxysilanes, such as 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-acryloxypropyltrimethoxysilane; amino group-containing alkoxysilanes such as N-2-(aminoethyl)3-aminopropyltrimethoxysilane, N-2-(aminoethyl)3-aminopropylmethyldimethoxysilane, 3-aminopropyltrimethoxysilane, 3-aminopropyltriethoxysilane, N-phenyl-3-aminopropyltrimethoxysilane, 3-allylaminopropyltrimethoxysilane, N—(N-vinylbenzyl)-2-aminoethyl-3-aminopropyltrimethoxysilane and hydrochloride thereof, N—(N-vinylbenzyl)-2-aminoethyl-3-aminopropylmethyldimethoxysilane and hydrochloride thereof; isocyanate alkoxysilanes such as 3-isocyanate propyltriethoxysilane and tris-(trimethoxysilylpropyl)-isocyanurate; and alkoxysilane compounds such as 3-ureidopropyltriethoxysilane, 3-chloropropyltrimethoxy-silane, 3-mercaptopropyltrimethoxysilane, 3-mercaptopropylmethyldimethoxysilane, and bis(trisethoxysilylpropyl)tetrasulfide. These alkoxysilanes may be used alone or in combination of two or more kinds, and it is not limited thereto.

Examples of the polysilazane include compounds such as 1,1,3,3-tetramethyldisilazane, hexamethyldisilazane, 1,3-divinyl-1,1,3,3-tetramethyldisilazane, 1,1,3,3,5,5-hexamethylcyclotrisilazane, but it is not limited thereto.

As the silicone-modified varnish, various silicone-modified varnishes such as alkyd-modified varnish, polyester-modified varnish, epoxy-modified varnish, and acrylic-modified varnish may be used, and it may be appropriately selected depending on the final use and the purpose.

Preferable examples of the organosilicon compound are alkoxysilanes. Among them, preferable alkoxysilanes are methyltrimethoxysilane and alkoxysilanes having a functional group, and selected from type generally designated as a silane coupling agent. For example, it may be exemplified by silane coupling agents such as vinyltrimethoxysilane, 3-glycidoxypropyltrimethoxysilane, and 3-aminopropyltrimethoxysilane.

Furthermore, partial hydrolysis condensates of alkoxysilane are also preferable as the organosilicon compound. In particular, alkoxysilane oligomer having both a functional group obtained by partial hydrolysis condensation of the silane coupling agent mentioned above and an alkoxysilyl group are preferable as the organosilicon compound. Specifically, epoxy group-containing alkoxysilane oligomer X-41-1059A (available from Shin-Etsu Chemical Co., Ltd.), amino group-containing alkoxysilane oligomer X-40-2651 (available from Shin-Etsu Chemical Co., Ltd.) and the like are preferable.

As a method for impregnating the fiber base with the thermosetting resin, either a solvent method or a hot melt method can be used. The solvent method is a method for preparing a resin varnish obtained by dissolving the thermosetting resin in an organic solvent, and impregnating the fiber base with the resin varnish. The hot melt method is a method for heating and melting a solid thermosetting resin and impregnating the fiber base with this thermosetting resin.

The method for curing the thermosetting resin with which the fiber base is impregnated is not particularly limited, and there may be mentioned a method of heating the thermosetting resin with which the fiber base is impregnated to cure the same.

As the method for producing the support base by treating the fiber base with an organosilicon compound and curing the same, common methods for processing a glass fiber can be applied.

Among them, as the method for applying the organosilicon compound onto the fiber base, common methods for applying to a glass fiber (coating method) can be used. Typical examples of the coating method include a direct gravure coater, a chamber doctor coater, an offset gravure coater, a single-roll-kiss coater, a reverse kiss coater, a bar coater, a reverse roll coater, a slot die, an air doctor coater, a normal rotation roll coater, a blade coater, a knife coater, a dip coater, an MB coater, and an MB reverse coater. Above all, a direct gravure coater, an offset coater, and a dip coater coating method are preferred for manufacturing the support base in the present invention.

Although the conditions are depending on the organosilicon compound to be used, curing may be performed by raising the temperature from room temperature to 300° C. for 1 minute to 24 hours after applying and drying. In this case, in view of productivity, cost, and workability, the support base is preferably manufactured by heat treatment from room temperature to 250° C. for 3 minutes to 4 hours, more preferably from room temperature to 230° C. for 5 minutes to 1 hour.

The coating solution used in the above-mentioned applying method is a solution in which the organosilicon compound is diluted with a solvent. Examples of the solvent include water and an organic solvent, and these may be used alone or in combination of two or more kinds. Examples of the organic solvent include alcohols such as methanol, ethanol, isopropanol, and n-butanol; ketones such as acetone, methyl ethyl ketone, and methyl isobutyl ketone; glycol ethers such as ethylene glycol and propylene glycol; aliphatic hydrocarbons such as hexane and heptane; aromatic hydrocarbons such as toluene and xylene; and ethers such as diethyl ether, diisopropyl ether, and di-n-butyl ether. It is also possible to further add an organic acid such as formic acid, acetic acid, propionic acid, and oxalic acid; a pH adjusting agent such as aqueous ammonia; a pigment, a filler, a surfactant, a thickener, etc., to the diluted solution.

In addition, an alkoxy group condensation catalyst may also be added, and examples thereof include an organometallic compound catalyst such as an organotin compound, an organotitanium compound, and an organobismuth compound; and an amine compound.

The organometallic compound condensation catalyst may be exemplified by metallic Lewis acids. Illustrative examples thereof include organotin compounds such as dibutyltin dimethoxide, dibutyltin diacetate, dibutyltin dioctoate, dibutyltin dilaurate, dibutyltin bis(acetyl-acetonato), dibutyltin bis(benzylmaleate), dimethyltin dimethoxide, dimethyltin diacetate, dioctyltin dioctoate, dioctyltin dilaurate, tin dioctoate, and tin dilaurate; organotitanium compounds such as tetraisopropyl titanate, tetra-normal-butyl titanate, tetra-tertiary-butyl titanate, tetra-normal-propyl titanate, tetra-2-ethylhexyl titanate, diisopropyl-di-tertiary-butyl titanate, dimethoxytitanium bisacetylacetonato, diisopropoxytitanium bisethylacetoacetate, di-tertiary-butoxytitanium bisethylacetoacetate, and di-tertiary-butoxytitanium bismethylacetoacetate; and organobismuth compounds such as bismuth tris(2-ethylhexanoate) and bismuth tris(neodecanoate). These may be used alone or in combination of two or more kinds.

Illustrative examples of the amine compound include hexylamine, di-2-ethylhexylamine, N,N-dimethyldodecylamine, di-n-hexylamine, dicyclohexylamine, di-n-octylamine, and hexamethoxymethylmelamine.

Among these condensation catalysts, organotitanium compounds are particularly preferable.

The coating solution is preferably an aqueous type coating solution in view of effect on the coating environment. An amino group-containing silane coupling agent (Product name: KBM-903, available from Shin-Etsu Chemical Co., Ltd.) is excellent in stability in an aqueous system and has good solubility, so that it is preferable as the organosilicon compound.

The thickness of the support base obtained by impregnating the fiber base with the thermosetting resin and curing the thermosetting resin is determined by the thickness of the fiber base, such as fiber cloth, to be used. For example, a thick support base can be manufactured by increasing the number of sheets of the fiber base such as fiber cloth and laminating these sheets.

A linear expansion coefficient in X-Y direction of the support base used in the present invention is preferably 0.5 to 25 ppm/° C., more preferably 1 to 20 ppm/° C. when the linear expansion coefficient is measured by using a sample cut from the support base with a width of 3 mm, a length of 25 mm, and a thickness of 50 to 300 µm, and subjecting the sample to tensile test in the temperature range of −60° C. to 200° C. at a temperature increase rate of 5° C./rain by using a thermomechanical analysis (TMA) apparatus.

The support base used in the present invention preferably does not have a glass transition temperature of 250° C. or less, more preferably does not have a glass transition temperature of 300° C. or less. If it does not have a glass transition temperature of 250° C. or less, the obtained substrate is excellent in heat resistance, and is inhibited from warping at high temperature, thereby being capable of responding to a demand for high density mounting and miniaturization of the printed substrate. In addition, when the organosilicon compound is used for the support base, a support base excellent in heat resistance and not having a glass transition temperature of 250° C. or less can be provided.

IV) Fiber Base Having Electromagnetic Wave Shielding Property

Among the above fiber bases, conductive fibers such as carbon fiber, metal-coated carbon fiber, metal fiber, and Ag-coated nylon fiber may be used as the fiber base having electromagnetic wave shielding property, in particular. Other preferable examples of the fiber base having sufficient electromagnetic wave shielding property include conductive fibers obtained by coating with Ag or Ni the surface of an inorganic fiber such as glass fiber and quartz glass fiber, an organic fiber such as aromatic polyamide fiber, polyimide fiber, and polyamideimide fiber, or an insulating fiber such as silicon carbide fiber, titanium carbide fiber, boron fiber, and alumina fiber; and fibers of Cu alloy, Fe alloy, and stainless steel (SUS).

These fiber base may be subjected to surface treatment with the organosilicon compound, and then thermally cured to obtain the support base.

Besides the above, a fiber base subjected to surface treatment with an organosilicon compound containing a filler that provide electromagnetic wave shielding property may also be used as the fiber base having electromagnetic wave shielding property.

As to the mesh of conductive fiber base, when the internal diameter of the mesh is several mm or less, sufficient electromagnetic wave shielding property can be obtained since the wavelength is several 10 cm in the one-segment band (about 500 MHz to 800 MHz), for example. In the case that the frequency of electromagnetic wave generated from semiconductor devices is 2 GHz, the diameter of the mesh is preferably 1 mm or less. From these reasons, the conductive fiber base has preferably mesh whose opening is at least 1.0 mm or less, more preferably 0.8 mm or less. In addition, it is effective and preferable to use the conductive fiber base of one sheet or a plurality of layered sheets for enhancing electromagnetic wave shielding property.

Particularly, by combining the conductive fiber base and the thermosetting resin having electromagnetic wave shielding property mentioned above, a support base having excellent electromagnetic wave shielding property can be obtained.

3. Support Base that Contains a Layer Composed of Metal

The support base in the present invention preferably contains a layer composed of metal. Examples of the layer composed of metal include a metal foil, a metal plate, metal-containing paste, and metal plating, but is not particularly limited to these. In particular, use of the metal foil allows to obtain an electromagnetic wave shielding support base-attached encapsulant in which flexibility of the support base is maintained. On the other hand, use of the metal plate enhances heat-dissipating property of the substrate, whereby a substrate having electromagnetic wave shielding property and high heat resistance can be obtained. Also, use of the metal plating allows to obtain an electromagnetic wave shielding support base-attached encapsulant in which thickness of the metal layer is controlled.

As the metal foil and the metal plate, any known metal foils and metal plates may be used. For example, the metal foil is preferably composed of copper, gold, silver, aluminum, nickel, tin, or the like, and the thickness thereof is preferably 0.5 to 50 µm, more preferably 1.0 to 20 µm. If the thickness of the metal foil is 0.5 µm or more, sufficient electromagnetic wave shielding effect can be obtained. On the other hand, if the thickness is 50 µm or less, electromagnetic wave shielding effect is not saturated, resulting in economical. Among these, a copper foil is preferred as the metal foil. Further, a foil the surface of which had been subjected to a chemical conversion treatment such as a black oxidization treatment, etc., may be suitably used. The conductive foil preferably used is a foil in which the contacting surface (the surface to be overlapped) with the support base has previously been subjected to a chemically or mechanically roughening treatment to heighten the adhesive effect. Illustrative examples of the conductive foil subjected to the surface roughening treatment include a roughened copper foil which has been electrochemically treated when an electrolytic copper foil is manufactured.

Examples of the metal plate include a copper plate, an aluminum plate, and a SUS plate. The thickness of the metal plate is not particularly limited. The metal plate suitably used in the present invention is a copper plate on which SUS layers each having a thickness of about 0.15 μm are laminated as antioxidant layers.

As a method of providing a metal foil or a metal plate onto the support base, a method generally used may be used without any specific limitation. For example, there may be mentioned a method in which a metal foil or a metal plate is laminated on one or both of surfaces of the support base. Examples of the laminating method include a pressing method, a laminating method, etc. Conditions of the pressing method and the laminating method may be appropriately selected depending on characteristics of the support base.

Figure 6A:
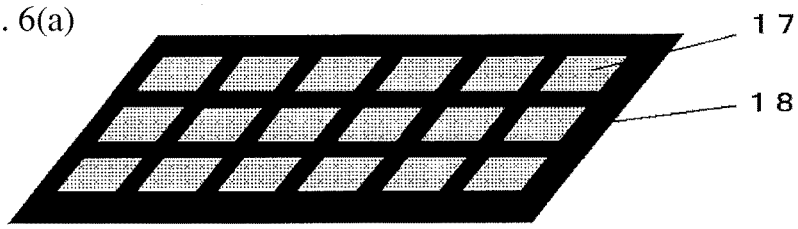
FIG. 6(a) to (d) shows an exemplary form of a metal layer in the electromagnetic wave shielding support base-attached encapsulant of the present invention.
Figure 6B:
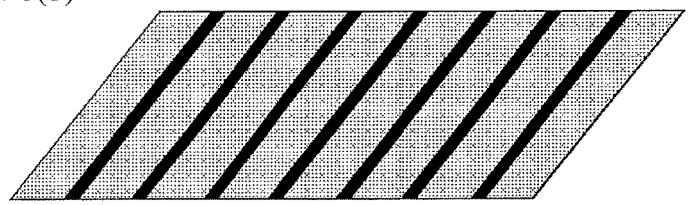
Figure 6C:
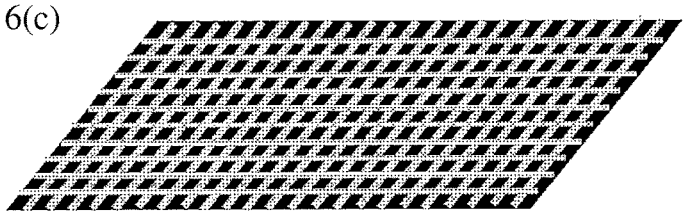
Figure 6D:
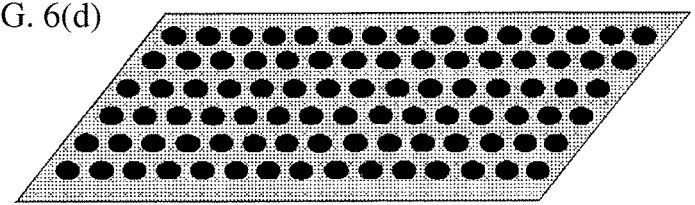

The layer composed of metal 17 preferably cover a part or whole of one surface or both surfaces of the support base 18 such that electromagnetic wave shielding property is not impaired. For example, the layer may be divided into blocks so as to cover semiconductor devices arranged on the substrate (FIG. 6(a)), slits may be provided with regular intervals (FIG. 6(b)), or mesh pattern or holes may be provided therein (FIGS. 6(c) and (d)). When the layer composed of metal has such a form, the support base having electromagnetic wave shielding effect can be obtained without impairing the effect of suppressing warping of a semiconductor package, which is one of aims of the support base.

In the present invention, an adhesive layer composed of an adhesive resin composition may be placed between the support base and the metal foil or the metal plate to be used, if necessary.

As the adhesive resin composition, a thermosetting resin (2-II) is preferred. When a support base having an adhesive layer composed of a thermosetting resin is used in the support base-attached encapsulant, a substrate excellent in heat resistance and discoloration resistance and having high mechanical strength can be obtained.

In the present invention, an adhesion-improving treatment may be applied to either or both of the support base and the adhesive layer to improve adhesion between the support base and the adhesive layer. The adhesion-improving treatment may be exemplified by a discharge treatment such as normal pressure plasma treatment, corona discharge treatment, and low-temperature plasma treatment; a surface swelling treatment by an alkali, a desmear treatment by permanganic acid, a primer treatment by a silane coupling agent, etc.

The adhesive layer is preferably bonded to the support base by at least one method of laminating, dipping, spray-coating, and bar-coating. In particular, laminating and dipping are preferred.

4. Support Base that Contains a Fiber Base and a Thermosetting Resin Either or Both of which have Electromagnetic Wave Shielding Property and Further Contains a Layer Composed of Metal The support base composed of a combination of the above items 1 to 3 is more excellent in electromagnetic wave shielding property.

Figure 5A:
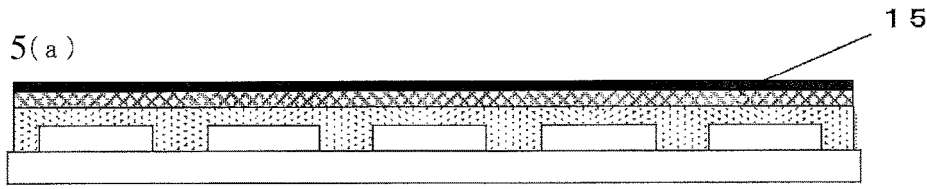
FIG. 5(a) shows an example of forming a surface-coating layer on the electromagnetic wave shielding support base-attached encapsulant of the present invention.
Figure 5B:
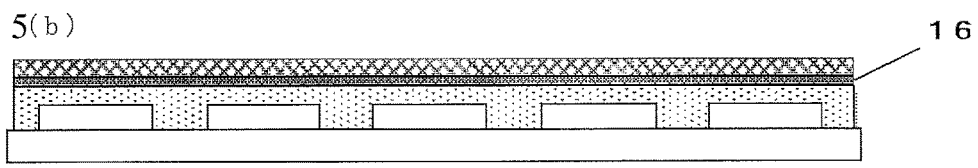
FIG. 5(b) shows an example of forming an insulating layer on an encapsulating layer side of the electromagnetic wave shielding support base-attached encapsulant of the present invention.

One or more insulating layers may be formed on one or both surfaces of the support base manufactured according to the items 1 to 4. Examples of the material constituting the insulating layer include a thermosetting resin not containing the conductive filler. By forming this layer (surface coated layer 15, FIG. 5(a)) on the support base to be used in the support base-attached encapsulant of the present invention, functions such as protection of an encapsulated surface, antioxidant, and laser-marking properties can be provided to the support base-attached encapsulant. Alternatively, by forming an insulating layer 16 (FIG. 5(b)) on a side where an encapsulating layer is to be formed, adhesiveness of the encapsulating layer and insulating properties of the support base and semiconductor devices to be encapsulated can be enhanced.

<Thermosetting Resin Layer>

The electromagnetic wave shielding support base-attached encapsulant of the present invention has a thermosetting resin layer. The thermosetting resin layer is preferably uncured or semi-cured. The thermosetting resin layer is composed of a thermosetting resin layer corresponding to an encapsulant and laminated on one surface of the support base. The thermosetting resin layer is used as a resin layer for encapsulating semiconductor devices.

The thickness of the thermosetting resin layer is preferably 20 μm to 5,000 μm. The thickness of the thermosetting resin layer depends on the thickness of the semiconductor devices, and may be a sufficient thickness to encapsulate the semiconductor device mounting surface of the substrate having semiconductor devices mounted thereon or the semiconductor device forming surface of the wafer having semiconductor devices formed thereon. By setting the amount such that the occurrence of a failure in filling due to the thermosetting resin layer being too thin is inhibited and an encapsulated substrate having semiconductor devices mounted thereon and an encapsulated wafer having semiconductor devices formed thereon is inhibited from becoming thicker than required due to the layer being too thick, a semiconductor apparatus with high reliability can be obtained.

The thermosetting resin to be used for the thermosetting resin layer is not particularly limited so long as it is a thermosetting resin generally used for encapsulating semiconductor devices. Illustrative examples thereof include a solid epoxy resin, a liquid epoxy resin, a silicone resin, a hybrid resin of an epoxy resin and a silicone resin, and a cyanate ester resin. In particular, the resin layer preferably contains any of an epoxy resin, a silicone resin, a hybrid resin of an epoxy resin and a silicone resin, and a cyanate ester resin each of which solidifies at temperatures lower than 50° C. and melts at temperatures ranging from 50° C. to 150° C. Specifically, the thermosetting resin mentioned above may be used.

[Epoxy Resin]

The epoxy resin is not particularly limited, but the amount of halogen ions such as chlorine and alkali ions such as sodium, contained therein, is preferably reduced as possible since the thermosetting resin layer composed of an epoxy resin is used as a resin layer for encapsulating semiconductor devices. An exemplary method of reducing these ions includes adding 10 g of a sample into 50 ml of ion exchanged water, sealing the mixture, leaving the mixture to stand in an oven at 120° C. for 20 hours, and then extracting the resultant sample under heating; it is then desired that all the ions in the sample extracted at 120° C. are 10 ppm or less.

In the thermosetting resin layer composed of an epoxy resin, a curing agent for epoxy resin may be contained. Examples of a usable curing agent include phenol resins such as phenol novolac resins, various kinds of amine derivatives, acid anhydrides, and those in which an acid anhydride group is partially ring-opened to form a carboxylic acid. Above all, a phenol novolac resin is desired to ensure the reliability of a semiconductor apparatus manufactured by using an encapsulated substrate having semiconductor devices mounted thereon obtained by being encapsulated with the electromagnetic wave shielding support base-attached encapsulant of the present invention. It is particularly preferred that an epoxy resin and a phenol novolac resin be mixed such that the ratio of the epoxy group to the phenolic hydroxyl group is 1:0.8 to 1:1.3.

In addition, imidazole derivatives, phosphine derivatives, amine derivatives, a metal compound such as an organic aluminum compound, etc., may be used as a reaction promoter to promote the reaction of the epoxy resin and the curing agent.

The thermosetting resin layer composed of an epoxy resin may further contain various kinds of additives, if necessary. For example, for the purpose of improving the properties of the resin, various kinds of thermoplastic resins, thermoplastic elastomers, organic synthetic rubbers, stress lowering agents of silicone type or other type, waxes, and additives such as a halogen-trapping agent, etc., may be added depending on the purpose.

[Silicone Resin]

As to the silicone resin, a thermosetting addition curable silicone resin, etc., are usable. Since the thermosetting resin layer composed of the addition curable silicone resin is used as a resin layer for encapsulating semiconductor devices, the amount of halogen ions such as chlorine and alkali ions such as sodium, contained therein, is preferably reduced as possible. An exemplary method of reducing these ions is the same as in the epoxy resin; it is desired that all the ions in the sample extracted at 120° C. be 10 ppm or less.

[Hybrid Resin of Epoxy Resin and Silicone Resin]

Examples of the epoxy resin and the silicone resin used in the hybrid resin include the above-mentioned epoxy resin and the above-mentioned silicone resin. Since the thermosetting resin layer composed of the hybrid resin is used as a resin layer for encapsulating semiconductor devices, the amount of halogen ions such as chlorine and alkali ions such as sodium, contained therein, is preferably reduced as possible. An exemplary method of reducing these ions is the same as in the epoxy resin and silicone resin; it is desired that all the ions in the sample extracted at 120° C. be 10 ppm or less.

[Cyanate Ester Resin]

As to the cyanate ester resin, the above-mentioned cyanate ester resin may be mentioned. Since the thermosetting resin layer composed of the cyanate ester resin is used as a resin layer for encapsulating semiconductor devices, the amount of halogen ions such as chlorine and alkali ions such as sodium, contained therein, is preferably reduced as possible. An exemplary method of reducing these ions is the same as in the epoxy resin, silicone resin, and the hybrid resin thereof; it is desired that all the ions in the sample extracted at 120° C. be 10 ppm or less.

[Inorganic Filler]

An inorganic filler may be contained in the thermosetting resin layer of the electromagnetic wave shielding support base-attached encapsulant of the present invention. As the inorganic filler, various inorganic fillers conventionally known may be used. Illustrative examples thereof include silica such as fused silica and crystalline silica, alumina, silicon nitride, aluminum nitride, aluminosilicate, boron nitride, glass fiber, and antimony trioxide. Average particle size and shape of these inorganic fillers are not particularly limited.

In particular, as the inorganic filler to be blended to the thermosetting resin layer composed of an epoxy resin, a filler previously subjected to surface treatment with a coupling agent such as a silane coupling agent and a titanate coupling agent may be blended to increase bonding strength of the epoxy resin and the inorganic filler.

Preferable examples of the coupling agent include epoxy functional alkoxysilanes such as γ-glycidoxypropyltrimethoxysilane, γ-glycidoxypropylmethyldiethoxysilane, and β-(3,4-epoxycyclohexyl)ethyltrimethoxysilane; amino functional alkoxysilanes such as N-β-(aminoethyl)-γ-aminopropyltrimethoxysilane, γ-aminopropyltriethoxysilane, and N-phenyl-γ-aminopropyltrimethoxysilane; and mercapto functional alkoxysilanes such as γ-mercaptopropyltrimethoxysilane. Incidentally, the blending amount of the coupling agent to be used for the surface treatment and a method of the surface treatment are not particularly limited.

Similarly, when adding to the thermosetting resin composed of the silicone resin composition, a material obtained by treating a surface of the inorganic filler with the above-mentioned coupling agent may be blended.

The blending amount of the inorganic filler is preferably 100 to 2,000 parts by mass, particularly preferably 150 to 1,000 parts by mass, based on 100 parts by mass of the total mass of the resin in the epoxy resin composition or the silicone resin composition. If it is 100 parts by mass or more, sufficient strength can be obtained. If it is 2,000 parts by mass or less, a reduction in flowability due to thickening can be suppressed and a failure in filling due to the reduction in flowability can also be suppressed, whereby the semiconductor devices formed on the wafer and the semiconductor devices arranged and mounted on the substrate can be excellently encapsulated.

In addition, electromagnetic wave shielding property can also be provided to the thermosetting resin layer. Particularly, the thermosetting resin layer containing a magnetically permeable filler is preferred since sufficient electromagnetic wave shielding effect can be obtained.

Examples of the magnetically permeable filler include alloys such as permalloy, Mu-metal, Mo-permalloy, supermalloy, and sendust, ferrite powders such as Mn—Zn type powder, Ni—Zn type powder, and flat Fe—Al—Si alloy powder, as exemplified in the resin containing electromagnetic wave shielding property.

The blending amounts of the magnetically permeable filler are preferably 30 to 1,500 parts by mass, more preferably 100 to 1,000 parts by mass, based on 100 parts by mass of the thermosetting resin. In view of workability and uniform dispersion, if the blending amount is 30 parts by mass or more, sufficient electromagnetic wave shielding property can be obtained. If the blending amount is less than 1,500 parts by mass, the viscosity of the thermosetting resin containing the magnetically permeable filler does not become too high, and thus flowability is sufficient. Therefore, as an encapsulant, sufficient homogeneity and sufficient strength can be achieved.

<Electromagnetic Wave Shielding Support Base-Attached Encapsulant>

FIG. 1 shows an exemplary cross-sectional view of the electromagnetic wave shielding support base-attached encapsulant of the present invention.

The electromagnetic wave shielding support base-attached encapsulant 10 of the present invention includes a support base 1 having electromagnetic wave shielding property and a thermosetting resin layer 2 corresponding to an encapsulant and laminated on one surface of the support base.

[Method for Manufacturing an Electromagnetic Wave Shielding Support Base-Attached Encapsulant]

As exemplary methods for manufacturing the electromagnetic wave shielding support base-attached encapsulant of the present invention using the electromagnetic wave shielding support base, there may be mentioned a method in which a thermosetting epoxy resin, an addition curable thermosetting silicone resin, or the like that is a solid at room temperature is molded on one surface of an electromagnetic wave shielding support base 1 by compression under heating, and a method in which a suitable amount of a polar solvent such as acetone is added to an epoxy resin composition to liquefy the mixture, a thin film is formed by printing or dispensing, etc., and the solvent is removed by heating under reduced pressure to uniformly form a thermosetting resin layer 2 on one surface of the electromagnetic wave shielding support base. It is preferred to use a support base the surface of which has been subjected to plasma treatment since wetting property, bonding property, and adhesiveness between the support base and the thermosetting resin layer are improved. Corona treatment is also effective.

In either of the methods, a thermosetting resin layer corresponding to an encapsulant, having a thickness of about 20 to 5,000 μm and having no void and no volatile component can be formed on one surface of the support base.

When such an electromagnetic wave shielding support base-attached encapsulant is employed, the support base can suppress the shrinkage stress of the thermosetting resin layer at the time of encapsulating and curing. Thus, even in the case that a large-diameter wafer or a large-area substrate such as inorganic, organic, or metal substrate is encapsulated, the semiconductor device mounting surface of the substrate having the semiconductor devices mounted thereon or the semiconductor device forming surface of the wafer having semiconductor devices formed thereon can be collectively encapsulated without occurrence of warping of the substrate or the wafer, peeling of the semiconductor devices from the substrate, and breakage of the wafer. In addition, the support base-attached encapsulant can exhibit excellent electromagnetic wave shielding property and reliability such as heat resistance and moisture resistance after encapsulating. Further, this electromagnetic wave shielding support base-attached encapsulant is extremely excellent in versatility, mass-productivity, workability, and economical efficiency.

<Substrate Having Semiconductor Devices Mounted Thereon and Wafer Having Semiconductor Devices Formed Thereon>

Figure 2A:
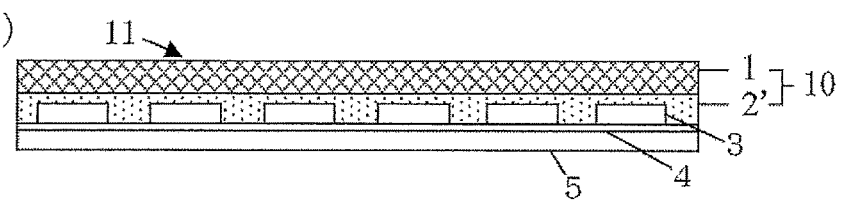
FIG. 2(a) shows an exemplary cross-sectional view of an encapsulated substrate having semiconductor devices mounted thereon that is obtained by being encapsulated with the electromagnetic wave shielding support base-attached encapsulant of the present invention.
Figure 2B:
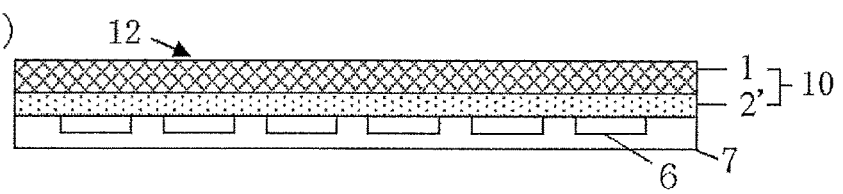
FIG. 2(b) shows an exemplary cross-sectional view of an encapsulated wafer having semiconductor devices formed thereon that is obtained by being encapsulated with the electromagnetic wave shielding support base-attached encapsulant of the present invention.

By using the electromagnetic wave shielding support base-attached encapsulant of the present invention, a semiconductor device mounting surface of a substrate having semiconductor devices mounted thereon or a semiconductor device forming surface of a wafer having semiconductor devices formed thereon can be collectively encapsulated. The substrate having the semiconductor devices mounted thereon may be exemplified by a substrate having a configuration that one or more semiconductor devices 3 are mounted on an inorganic, metal, or organic substrate 5 through an adhesive 4, as shown in FIG. 2(a). The wafer having the semiconductor devices formed thereon may be exemplified by a wafer having a configuration that semiconductor devices 6 are formed on a wafer 7, as shown in FIG. 2(b). It is to be noted that the substrate having semiconductor devices mounted thereon includes semiconductor-devices-array on which semiconductor devices are mounted and aligned, for example.

<Encapsulated Substrate Having Semiconductor Devices Mounted Thereon and Encapsulated Wafer Having Semiconductor Devices Formed Thereon>

FIGS. 2(a) and 2(b) show exemplary cross-sectional views of an encapsulated substrate having semiconductor devices mounted thereon and an encapsulated wafer having semiconductor devices formed thereon that are obtained by being encapsulated with the electromagnetic wave shielding support base-attached encapsulant of the present invention. In the encapsulated substrate having semiconductor devices mounted thereon 11 of the present invention, a semiconductor device mounting surface of a substrate 5 having semiconductor devices 3 mounted thereon is covered with the thermosetting resin layer 2 (see FIG. 1) of the electromagnetic wave shielding support base-attached encapsulant 10, the thermosetting resin layer 2 (see FIG. 1) is heated and cured to provide a cured thermosetting resin layer 2', and the surface is collectively encapsulated with the electromagnetic wave shielding support base-attached encapsulant 10 (FIG. 2(a)). Furthermore, in the encapsulated wafer having semiconductor devices formed thereon 12 of the present invention, a semiconductor device forming surface of a wafer 7 having semiconductor devices 6 formed thereon is covered with the thermosetting resin layer 2 (see FIG. 1) of the electromagnetic wave shielding support base-attached encapsulant 10, the thermosetting resin layer 2 (see FIG. 1) is heated and cured to provide the cured thermosetting resin layer 2', and the surface is collectively encapsulated with the electromagnetic wave shielding support base-attached encapsulant 10 (FIG. 2(b)).

As described above, in the encapsulated substrate having semiconductor devices mounted thereon and the encapsulated wafer having semiconductor devices formed thereon that are obtained by covering a semiconductor device mounting surface of a substrate having semiconductor devices mounted thereon or a semiconductor device forming surface of a wafer having semiconductor devices formed thereon with the thermosetting resin layer of the electromagnetic wave shielding support base-attached encapsulant, and heating and curing the thermosetting resin layer to collectively encapsulate the semiconductor device mounting surface or the semiconductor device forming surface by the electromagnetic wave shielding support base-attached encapsulant, occurrence of warping of the substrate or the wafer, peeling of the semiconductor devices from the substrate, and breakage of the wafer are inhibited and electromagnetic wave shielding property is provided.

<Semiconductor Apparatus>

Figure 3A:
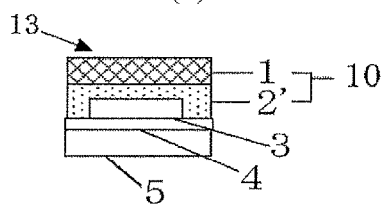
FIG. 3(a) shows an exemplary cross-sectional view of the semiconductor apparatus of the present invention manufactured from the encapsulated substrate having semiconductor devices mounted thereon.

FIGS. 3(a) and (b) show examples of the semiconductor apparatus of the present invention. the semiconductor apparatuses 13, 14 of the present invention are obtained by dicing the encapsulated substrate having semiconductor devices mounted thereon 11 (see FIG. 2) or the encapsulated wafer having semiconductor devices formed thereon 12 (see FIG. 2) into each piece. As described above, the semiconductor apparatuses 13, 14 manufactured by dicing into each piece the encapsulated substrate having semiconductor devices mounted thereon 11 (see FIG. 2) or the encapsulated wafer having semiconductor devices formed thereon 12 (see FIG. 2), which has been encapsulated with the electromagnetic wave shielding support base-attached encapsulant excellent in reliability such as heat resistance, electrical insulation property, light resistance, and moisture resistance and configured to inhibit warping of the substrate or the wafer and peeling of the semiconductor devices 3 from the substrate, is high quality.

Figure 3B:
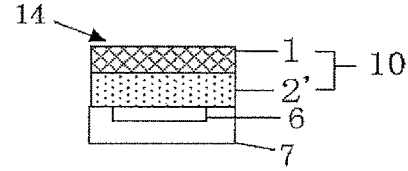
FIG. 3(b) shows an exemplary cross-sectional view of the semiconductor apparatus of the present invention manufactured from the encapsulated wafer having semiconductor devices formed thereon.

When the encapsulated substrate having semiconductor devices mounted thereon 11 (see FIG. 2(*a*)) is diced into each piece, the obtained semiconductor apparatus 13 has the semiconductor devices 3 mounted on the substrate 5 through the adhesive 4 and is encapsulated with the electromagnetic wave shielding support base-attached encapsulant 10 composed of the cured thermosetting resin layer 2' and the support base 1 from above (FIG. 3(*a*)). Furthermore, when the encapsulated wafer having semiconductor devices formed thereon 12 (see FIG. 2(*b*)) is diced into each piece, the obtained semiconductor apparatus 14 has the semiconductor devices 6 formed on the wafer 7 and is encapsulated with the electromagnetic wave shielding support base-attached encapsulant 10 composed of the cured thermosetting resin layer 2' and the support base 1 from above (FIG. 3(*b*)).

In this way, the semiconductor apparatus obtained by dicing into each piece the encapsulated substrate having semiconductor devices mounted thereon or the encapsulated wafer having semiconductor devices formed thereon, which has been encapsulated with the electromagnetic wave shielding support base-attached encapsulant excellent in reliability such as heat resistance and moisture resistance and inhibited from warping, is high quality.

<Method for Manufacturing a Semiconductor Apparatus>

As one aspect, a method for manufacturing a semiconductor apparatus using the electromagnetic wave shielding support base-attached encapsulant is shown as follows.

A semiconductor apparatus can be manufactured by a method including:

a covering step of covering a semiconductor device mounting surface of a substrate having semiconductor devices mounted thereon or a semiconductor device forming surface of a wafer having semiconductor devices formed thereon with the thermosetting resin layer of the above-mentioned electromagnetic wave shielding support base-attached encapsulant;

an encapsulating step of collectively encapsulating the semiconductor device mounting surface of the substrate or the semiconductor device forming surface of the wafer by heating and curing the thermosetting resin layer to provide an encapsulated substrate having semiconductor devices mounted thereon or an encapsulated wafer having semiconductor devices formed thereon; and a piece forming step of dicing the encapsulated substrate having semiconductor devices mounted thereon or the encapsulated wafer having semiconductor devices formed thereon into each piece to manufacture a semiconductor apparatus.

Figure 4:
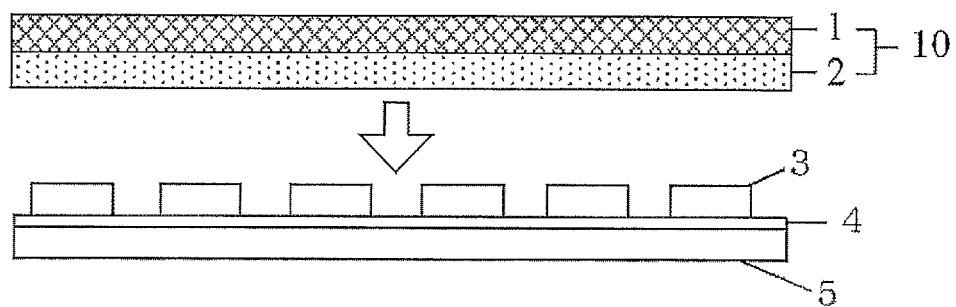
FIG. 4 shows an exemplary flowchart of a method for manufacturing a semiconductor apparatus from a substrate having semiconductor devices mounted thereon by using the electromagnetic wave shielding support base-attached encapsulant of the present invention.
Figure 4:
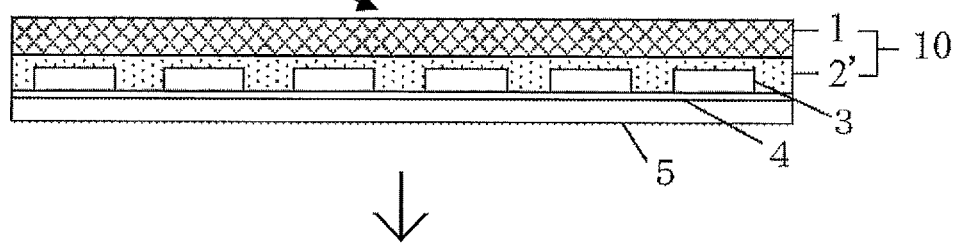
Figure 4:
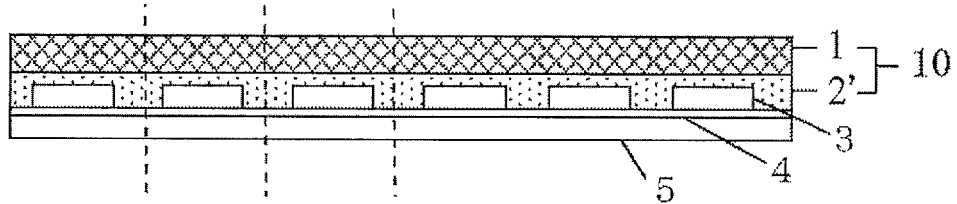
Figure 4:
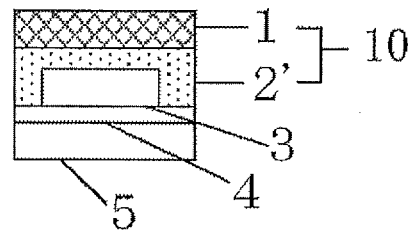

Hereinafter, an exemplary method for manufacturing a semiconductor apparatus of the present invention will be described with reference to FIG. 4.

[Covering Step]

The covering step is a step of covering a semiconductor device mounting surface of a substrate 5 having semiconductor devices 3 mounted thereon through an adhesive 4 or a semiconductor device forming surface of a wafer (not shown) having semiconductor devices (not shown) formed thereon with the thermosetting resin layer 2 of the electromagnetic wave shielding support base-attached encapsulant 10 having the support base 1 and the thermosetting resin layer 2 (FIG. 4(A)).

[Encapsulating Step]

The encapsulating step is a step of heating and curing the thermosetting resin layer 2 of the electromagnetic wave shielding support base-attached encapsulant 10 to provide the cured thermosetting resin layer 2' and thereby collectively encapsulating the semiconductor device mounting surface of the substrate 5 having semiconductor devices 3 mounted thereon or the semiconductor device forming surface of the wafer (not shown) having semiconductor devices (not shown) formed thereon to provide the encapsulated substrate having semiconductor devices mounted thereon 11 or the encapsulated wafer having semiconductor devices formed thereon (not shown) (FIG. 4(B)).

[Piece Forming Step]

The piece forming step is a step of dicing the encapsulated substrate having semiconductor devices mounted thereon 11 or the encapsulated wafer having semiconductor devices formed thereon (not shown) into each piece, thereby manufacturing the semiconductor apparatus 13 or 14 (see FIG. 3(*b*)) (FIGS. 4(C) and 4(D)).

Specific description will now be given hereinafter, but the present invention is not limited thereto. At the covering step and the encapsulating step, when a vacuum compression molding apparatus, a vacuum laminator apparatus, or the like is adopted, covering and encapsulating without void and warpage can be carried out. As a method of lamination, any methods including roll lamination, diaphragm type vacuum lamination, air-pressure lamination, and others can be used. Among them, using both the vacuum lamination and the air-pressure method is preferable.

Here, description will be given as to an example of using the vacuum lamination apparatus manufactured by Nichigo-Morton Co., Ltd., to encapsulate a silicon wafer having a thickness of 250 μm and a diameter of 300 mm (12 inches) with a support base-attached encapsulant having a support base obtained by impregnating and curing a carbon fiber (fiber base) having a thickness of 50 μm with γ-glycidoxypropyltrimethoxysilane (KBM-403, available from Shin-Etsu Chemical Co., Ltd.) and further having a thermosetting resin layer composed of a thermosetting silicone resin having a thickness of 50 μm and formed on one surface of the support base.

In upper and lower plates each having built-in heater and set at 150° C., the upper plate has a diaphragm rubber appressed against the heater under reduced pressure. A silicon wafer of 300 mm (12 inches) is set on the lower plate, and the support base-attached encapsulant is then placed on the silicon wafer so that the thermosetting resin layer surface faces a semiconductor forming surface of the silicon wafer. Then, the lower plate is moved up, the upper and lower plates are closely attached to each other to define a vacuum chamber by an O-ring installed so as to surround the silicon wafer set on the lower plate, and a pressure inside the vacuum chamber is reduced. When the pressure inside the vacuum chamber is sufficiently reduced, a valve of a pipe connected to a vacuum pump from a space between the diaphragm rubber of the upper plate and the heater is closed to send compressed air. As a result, the upper diaphragm rubber inflates to sandwich the silicon wafer and the support base-attached encapsulant between the upper diaphragm rubber and the lower plate, and vacuum lamination and curing of the thermosetting silicone resin simultaneously advance to complete the encapsulation. A time of approximately 3 to 20 minutes is sufficient for curing. After the vacuum lamination is completed, the pressure inside the vacuum chamber is restored to normal pressure, the lower plate is moved down, and the encapsulated silicon wafer is taken out. The wafer can be encapsulated without void or warpage by the above-mentioned process. The taken-out silicon wafer is usually subjected to post cure at a temperature of 150 to 180° C. for 1 to 4 hours, thereby stabilizing electrical characteristics and mechanical characteristics.

The covering and encapsulating steps using the vacuum lamination apparatus are not restricted to the case that a carbon fiber is used as the fiber base and a silicone resin is used as the thermosetting resin as exemplified above, and they can also be used in other cases that a metal fiber or a conductive fiber obtained by Ag-coating the surface of insulating fiber such as glass fiber is used as the fiber base, and an epoxy resin or a hybrid resin of epoxy and silicone is used as the thermosetting resin.

According to such a method for manufacturing a semiconductor apparatus, the semiconductor device mounting surface or the semiconductor device forming surface can be easily covered with the thermosetting resin layer of the support base-attached encapsulant without a filling failure at the covering step. Further, since the support base-attached encapsulant is used, the support base can suppress shrinkage stress of the thermosetting resin layer at the timing of curing; the semiconductor device mounting surface or the semiconductor device forming surface can be thereby collectively encapsulated at the encapsulating step; and the encapsulated substrate having semiconductor devices mounted thereon or the encapsulated wafer having semiconductor devices formed thereon can be obtained without warping of the substrate or the wafer and peeling of the semiconductor devices from the substrate even when a thin large-diameter wafer or a large-area substrate such as metal substrate is collectively encapsulated. Furthermore, at the piece forming step, the encapsulated substrate having semiconductor devices mounted thereon or the encapsulated wafer having semiconductor devices formed thereon, which has been encapsulated with the electromagnetic wave shielding support base-attached encapsulant excellent in reliability such as heat resistance and moisture resistance and is inhibited from warping, can be diced into each piece as a semiconductor apparatus, thereby providing the method for manufacturing a semiconductor apparatus that enables a high-quality semiconductor apparatus to be manufactured.

EXAMPLES

Hereinafter, the present invention will be described in detail with reference to Synthesis Examples, Preparation Examples, Examples, and Comparative Examples, but the present invention is not restricted to the following examples.

Synthesis Example 1

Organosilicon Compound Having Nonconjugated Double Bond (A1)

27 mol of organosilane represented by $PhSiCl_3$, 1 mol of $ClMe_2SiO(Me_2SiO)_{33}SiMe_2Cl$, and 3 mol of $MeViSiCl_2$ were dissolved in a toluene solvent. The solvent was then added dropwise into water, co-hydrolyzed, washed with water, neutralized by alkali washing, dehydrated, and stripped to synthesize an organosilicon compound having a nonconjugated double bond (A1).

The composition ratio of constituent units in this compound is represented by the formula: $[PhSiO_{3/2}]_{0.27}$ [—$SiMe_2O$—($Me_2SiO)_{33}$—$SiMe_2O$—$]_{0.01}$[$MeVi$ $SiO_{2/2}]_{0.03}$. The weight average molecular weight of the compound was 62,000, and the melting point was 60° C. It is to be noted that Vi in the composition formula denotes a vinyl group represented by (—C=C).

Synthesis Example 2

Organohydrogenpolysiloxane (B1)

27 mol of organosilane represented by $PhSiCl_3$, 1 mol of $ClMe_2SiO(Me_2SiO)_{33}SiMe_2Cl$, and 3 mol of $MeHSiCl_2$ were dissolved in a toluene solvent. The solvent was then added dropwise into water, co-hydrolyzed, washed with water, neutralized by alkali washing, dehydrated, and stripped to synthesize organohydrogenpolysiloxane (B1).

The composition ratio of constituent units of this resin is represented by the formula: $[PhSiO_{3/2}]_{0.27}$[—$SiMe_2O$-($Me_2SiO)_{33}$—$SiMe_2O$-$]_{0.01}$[$MeHSi_{2/2}]_{0.03}$. The weight average molecular weight of the resin was 58,000, and the melting point was 58° C.

Preparation Example 1

A 300-mesh stainless steel wire net (mesh: 300 mesh/2.54 cm, opening size: 55 μm, open area ratio: 42%, wire diameter: 30 μm, thickness: 70 μm) was impregnated with 3-aminopropyltrimethoxysilane (Product name: KBM-903, available from Shin-Etsu Chemical Co., Ltd.) used as the organosilicon compound, and the impregnated material was dried under heating at 100° C. for 10 minutes. Thereafter, the resultant material was subjected to heat treatments at 100° C. for 1 hour and 200° C. for 1 hour to prepare an electromagnetic wave shielding support base (1-a).

As regards electromagnetic wave shielding property of this support base, the following results were obtained.
Measuring method: KEC method
Measurement results: 100 MHz 60 dB
  300 MHz 48 dB
  500 MHz 45 dB
  1,000 MHz 32 dB
Thus, electromagnetic wave shielding property was found.

Preparation Example 2

60 parts by mass of a cresol novolac epoxy resin (EOCN-1020, available from NIPPON KAYAKU Co., Ltd.) and 30 parts by mass of a phenol novolac resin (H-4, available from Gun Ei Chemical Industry Co., Ltd.) were dissolved in 400 parts by mass of MEK (methyl ethyl ketone) by a planetary mixer. Then, 15 parts by mass of surface-treated aerosol silica, 500 parts by mass of a 10% Ag-coated Cu powder having an average particle size of 5.89 μm (available from Fukuda Metal Foil & Powder Co., Ltd.), 0.6 part by mass of an imidazole catalyst (2E4MZ, available from Shikoku Chemicals Corporation), 0.5 part by mass of a silane coupling agent (KBM-403, available from Shin-Etsu Chemical Co., Ltd.) were added thereto, and stirred sufficiently to obtain a MEK dispersion of the epoxy resin composition.

A plain-woven carbon fiber (density: 22.5 warp yarns/25 mm, 22.5 weft yarns/25 mm, thickness: 150 mass: 119 g/m²) used as the fiber base was dipped in the MEK dispersion of the epoxy resin composition to impregnate the carbon fiber with the MEK dispersion, and then left to stand at 60° C. for 2 hours to volatilize MEK. Thereafter, the material was molded under pressure by a hot pressing apparatus at 150°

C. for 10 minutes, and further cured at 180° C. for 4 hours to prepare an electromagnetic wave shielding support base (2-a).

As regards electromagnetic wave shielding property of this support base, the following results were obtained.
Measuring method: KEC method
Measurement results: 100 MHz 62 dB
  300 MHz 50 dB
  500 MHz 45 dB
  1,000 MHz 33 dB
Thus, electromagnetic wave shielding property was found.

Preparation Example 3

To a composition comprising 50 parts by mass of the organosilicon compound having a nonconjugated double bond (A1), 50 parts by mass of the organohydrogenpolysiloxane (B1), 0.2 part by mass of acetylene alcohol-based ethynylcyclohexanol as a reaction inhibitor, and 0.1 part by mass of an octyl alcohol-modified solution of a chloroplatinic acid were added 15 parts by mass of surface-treated aerosol silica and 300 parts by mass of 8% Ag-coated glass bead having an average particle diameter of 22 μm (available from Potters Ballotini Co., Ltd.), and the mixture was well stirred by a planetary mixer heated at 60° C. to prepare a silicone resin composition. This composition was a solid at room temperature (25° C.)

To 100 parts by mass of the obtained composition was added 100 parts by mass of toluene to prepare a coating solution. A plain-woven carbon fiber (density: 22.5 warp yarns/25 mm, 22.5 weft yarns/25 mm, thickness: 150 μm, mass: 119 g/m$^2$) was impregnated with the coating solution, and then dried under heating at 100° C. for 10 minutes in the same manner as in Preparation Example 1. Thereafter, the resultant material was subjected to heat treatments at 100° C. for 1 hour and 200° C. for 1 hour to prepare an electromagnetic wave shielding support base (3-a).

As regards electromagnetic wave shielding property of this support base, the following results were obtained.
Measuring method: KEC method
Measurement results: 100 MHz 60 dB
  300 MHz 50 dB
  500 MHz 47 dB
  1,000 MHz 35 dB
Thus, electromagnetic wave shielding property was found.

Preparation Example 4

An adhesive made of a silicone resin (Product name: KE-109, available from Shin-Etsu Chemical Co., Ltd.) was applied onto one surface of the electromagnetic wave shielding support base obtained in Preparation Example 1, and a Cu foil (available from Fukuda Metal Foil & Powder Co., Ltd., thickness: 18 μm) was bonded thereto. The material was then molded under pressure by a hot pressing apparatus at 150° C. for 30 minutes, and the resulting material was further secondary cured at 150° C. for 1 hour to prepare an electromagnetic wave shielding support base (4-a) with a 3-layered structure composed of the support base made of the stainless steel wire net treated with the organosilicon compound, the adhesive made of a silicone resin, and the Cu foil layer formed on an opposite side to an encapsulant.

As regards electromagnetic wave shielding property of this support base, the following results were obtained.
Measurement results: 100 MHz 65 dB
  300 MHz 55 dB
  500 MHz 50 dB
  1,000 MHz 38 dB
Thus, electromagnetic wave shielding property was found.

[Substrate Having Semiconductor Devices Mounted Thereon]

A BT (bismaleimide triazine) resin substrate having a thickness of 100 μm, a size of 240 mm×240 mm, and a linear expansion coefficient of 10 ppm/° C. was prepared as an organic resin substrate. This substrate had a Cu wiring so as to be capable of mounting 168 chips having a size of 7.3 mm×7.3 mm (having a full area pad with a pad diameter of 100 μm and a pad pitch of 300 μm; a peripheral lead with a lead width of 20 μm and a lead pitch of 80 μm). On the Cu-wiring forming surface of the substrate was flip-chip bonded 168 silicon chips having a size of 7.3 mm×7.3 mm and a thickness of 100 μm that were arranged such that a 30-μm-height Cu pillar and a 15-μm SnAg could be connected with the wiring. The height of a gap defined between the chips and the substrate after the connection was about 48 μm.

Example 1

[Preparation of Resin Composition of Thermosetting Resin Layer]

60 parts by mass of a cresol novolac type epoxy resin (EOCN-1020, available from NIPPON KAYAKU Co., Ltd.), 30 parts by mass of a phenol novolac resin (H-4, available from Gun Ei Chemical Industry Co., Ltd.), 350 parts by mass of spherical silica having an average particle diameter of 0.6 μm in which 0.08% by mass of particles with a particle diameter of 10 μm or more is contained, 0.8 part by mass of a catalyst TPP (triphenylphosphine), and 0.5 part by mass of a silane coupling agent KBM-403 (γ-glycidoxypropyltrimethoxysilane, available from Shin-Etsu Chemical Co., Ltd.) were sufficiently mixed by a high-speed mixing apparatus. The resultant mixture was heated and kneaded with a continuously kneading apparatus to form a sheet with a thickness of about 150 μm, and the sheet was then cooled.

[Manufacture of Electromagnetic Wave Shielding Support Base-Attached Encapsulant]

The electromagnetic wave shielding support base (1-a) prepared in Preparation Example 1 was cut into a size of 230 mm×230 mm, and subjected to argon plasma treatment. The sheet made of the epoxy resin composition was laminated on one surface of the support base, and a PET film subjected to a fluorine resin treatment (a release film) was laminated on the epoxy resin composition-laminated surface. The laminate was crimped at 50° C. to manufacture an electromagnetic wave shielding support base-attached encapsulant (1-b) having the thermosetting resin layer composed of the epoxy resin composition with a thickness of 150 μm formed on one surface of the electromagnetic wave shielding support base (1-a).

[Covering and Encapsulation of Substrate Having Semiconductor Devices Mounted Thereon]

The substrate having semiconductor devices mounted thereon was encapsulated with the manufactured electromagnetic wave shielding support base-attached encapsulant (1-b) by using a vacuum laminating apparatus (manufactured by Nichigo-Morton Co., Ltd.). The temperature of the upper and lower plates was previously set at 150° C., the substrate having semiconductor devices mounted thereon was placed on the lower plate, and the electromagnetic wave shielding support base-attached encapsulant (1-b) from which the release film has been removed was then placed thereon so that the epoxy resin composition layer constituting the thermosetting resin layer of the electromagnetic wave shielding support base-attached encapsulant (1-b) faced the semiconductor device mounting surface. Subsequently, the lower plate was raised to come into close contact with the upper plate so that the vacuum chamber was defined. After the pressure inside the vacuum chamber was reduced to 50 Pa, the atmosphere between the upper plate and the diaphragm rubber was opened, and compressed air with a pressure of 0.5 MPa was applied for compression molding for 5 minutes. After molding, post-cure was performed at 180° C. for 4 hours to obtain an encapsulated substrate having semiconductor devices mounted thereon (1-c). The substrate was attached to a dicing tape to cut by dicing into individual pieces, so that a semiconductor apparatus with a size of 16 mm×16 mm was manufactured.

Example 2

An electromagnetic wave shielding support base-attached encapsulant (2-b) was manufactured in the same manner as in Example 1 except for using the electromagnetic wave shielding support base (2-a) prepared in Preparation Example 2 in place of the electromagnetic wave shielding support base (1-a) prepared in Preparation Example 1 as the support base. Further, the substrate having semiconductor devices mounted thereon was encapsulated with the electromagnetic wave shielding support base-attached encapsulant to obtain an encapsulated substrate having semiconductor devices mounted thereon (2-c). The substrate was attached to a dicing tape to cut by dicing into individual pieces, so that a semiconductor apparatus with a size of 16 mm×16 mm was manufactured.

Example 3

[Preparation of Resin Composition of Thermosetting Resin Layer]

To a composition comprising 50 parts by mass of the organosilicon compound having a nonconjugated double bond (A1), 50 parts by mass of organohydrogenpolysiloxane (B1), 0.2 part by mass of acetylene alcohol-based ethynylcyclohexanol as a reaction inhibitor, and 0.1 part by mass of an octyl alcohol-modified solution of a chloroplatinic acid was added 350 parts by mass of spherical silica having an average particle diameter of 5 μm, and the mixture was well stirred with a planetary mixer heated at 60° C. to prepare a silicone resin composition. This composition was a solid at room temperature (25° C.)

[Manufacture of Electromagnetic Wave Shielding Support Base-Attached Encapsulant]

The Electromagnetic Wave Shielding Support Base (3-a) prepared in Preparation Example 3 was cut into a size of 230 mm×230 mm, and subjected to argon plasma treatment. Then, the silicone resin composition was sandwiched between the electromagnetic wave shielding support base and a PET film coated with a fluorine resin (a release film), and compression molding was carried out using a hot press apparatus at 80° C. under a pressure of 5 t for 5 minutes to manufacture a electromagnetic wave shielding support base-attached encapsulant (3-b) having a thermosetting resin layer composed of the silicone resin composition with a thickness of 150 μm formed on one surface of the support base.

[Covering and Encapsulation of Substrate Having Semiconductor Devices Mounted Thereon]

The substrate having semiconductor devices mounted thereon was encapsulated with the manufactured electromagnetic wave shielding support base-attached encapsulant (3-b) by using a vacuum laminating apparatus (manufactured by Nichigo-Morton Co., Ltd.). The temperature of the upper and lower plates was previously set at 130° C., the substrate having semiconductor devices mounted thereon was placed on the lower plate, and the electromagnetic wave shielding support base-attached encapsulant (3-b) from which the release film has been removed was then placed thereon so that the silicone resin composition layer constituting the thermosetting resin layer of the electromagnetic wave shielding support base-attached encapsulant (3-b) faced the semiconductor device mounting surface. Subsequently, the lower plate was raised to come into close contact with the upper plate so that the vacuum chamber was defined. After the pressure inside the vacuum chamber was reduced to 50 Pa, the atmosphere between the upper plate and the diaphragm rubber was opened, and compressed air with a pressure of 0.5 MPa was applied for compression molding for 5 minutes. After molding, post-cure was performed at 150° C. for 2 hours to obtain an encapsulated substrate having semiconductor devices mounted thereon (3-c). The substrate was attached to a dicing tape to cut by dicing into individual pieces, so that a semiconductor apparatus with a size of 16 mm×16 mm was manufactured.

Example 4

An electromagnetic wave shielding support base-attached encapsulant (4-b) having the epoxy resin composition layer formed on the opposite side to the Cu foil layer was manufactured in the same manner as in Example 1 except for using the electromagnetic wave shielding support base (4-a) prepared in Preparation Example 4 in place of the electromagnetic wave shielding support base (1-a) prepared in Preparation Example 1 as the support base. Further, the substrate having semiconductor devices mounted thereon was encapsulated with this electromagnetic wave shielding support base-attached encapsulant to obtain an encapsulated substrate having semiconductor devices mounted thereon (4-c). The substrate was attached to a dicing tape to cut by dicing into individual pieces, so that a semiconductor apparatus with a size of 16 mm×16 mm was manufactured.

Comparative Example 1

[Manufacture of Encapsulating Sheet]

The epoxy resin composition prepared in Example 1 was molded into a sheet having a thickness of about 220 μm in the same manner as in Example 1 to manufacture an encapsulating sheet (5-b) composed of the epoxy resin alone. After molding, the sheet was cut into a size of 230 mm×230 mm.

[Covering and Encapsulation of Substrate Having Semiconductor Devices Mounted Thereon]

The substrate having semiconductor devices mounted thereon was encapsulated with the manufactured encapsulating sheet (5-b) by using a vacuum laminating apparatus (manufactured by Nichigo-Morton Co., Ltd.). At this time, the temperature of the upper and lower plates was set at 150° C. After molding, post-cure was performed at 180° C. for 4 hours to obtain an encapsulated substrate having semiconductor devices mounted thereon (5-c). The substrate was attached to a dicing tape to cut by dicing into individual pieces, so that a semiconductor apparatus with a size of 16 mm×16 mm was manufactured.

Comparative Example 2

[Manufacture of Encapsulating Sheet]

The silicone resin composition prepared in Example 3 was sandwiched between a PET film (a pressurization base film) and a PET film coated with a fluorine resin (a release film), compression molding was carried out using a hot press apparatus at 80° C. under a pressure of 5 t for 5 minutes, and the composition was molded into a sheet having a thickness of 300 μm to manufacture an encapsulating sheet (6-b) composed of the silicone resin alone. After molding, the sheet was cut into a size of 230 mm×230 mm.

[Covering and Encapsulation of Substrate Having Semiconductor Devices Mounted Thereon]

The substrate having semiconductor devices mounted thereon was encapsulated with the manufactured encapsulating sheet (6-b) by using a vacuum laminating apparatus (manufactured by Nichigo-Morton Co., Ltd.). The temperature of the upper and lower plates was previously set at 130° C., the substrate having semiconductor devices mounted thereon was placed, and the encapsulating sheet (6-b) composed of the silicone resin composition alone from which the release film has been removed was then laminated thereon. Thereafter, the PET film (the pressurization base film) was also removed, then the plate was closed, and compression molding was carried out for 5 minutes to perform curing and encapsulating. After the curing and encapsulating, post-cure was performed at 150° C. for 2 hours to obtain an encapsulated substrate having semiconductor devices mounted thereon (6-c). The substrate was attached to a dicing tape to cut by dicing into individual pieces, so that a semiconductor apparatus with a size of 16 mm×16 mm was manufactured.

Then, warpage, appearances, an adhesion state between the resin and the substrate, and whether each semiconductor device has been peeled from the substrate were checked with respect to the encapsulated substrates having semiconductor devices mounted thereon (1-c) to (6-c) obtained by encapsulating in Examples 1 to 4 and Comparative Examples 1 and 2. The results were shown in Table 1. Here, in regard to the appearance, presence of voids and unfilled portions were checked, and the appearance was determined to be good when these factors were not found. Moreover, the adhesion state was determined to be good when peeling did not occur at the time of molding.

In addition, the encapsulated substrates having semiconductor devices mounted thereon in Examples 1 to 4 and Comparative Examples 1 and 2 were each diced into individual pieces, and the following heat resistance test and moisture resistance test were conducted. In the heat resistance test, a heat cycle test was performed with respect to a test piece (the test piece was maintained at −25° C. for 10 minutes, and then maintained at 125° C. for 10 minutes. This cycle was repeated 1,000 times) to evaluate whether electrical conduction can be achieved after the test. Further, in the moisture resistance test, a direct-current voltage of 10 V was applied to both poles of a circuit of this test piece under conditions with a temperature of 85° C. and a relative humidity of 85% to evaluate whether a short circuit occurs, by using a migration tester (MIG-86, manufactured by IMV Corporation).

TABLE 1

|  | Example 1 | Example 2 | Example 3 | Example 4 | Comparative Example 1 | Comparative Example 2 |
| --- | --- | --- | --- | --- | --- | --- |
| Warpage of substrate (mm) | 0.2 | 0.3 | 1.2 | 0.8 | 9 | 15 |
| Appearance | good | good | good | good | good | good |
| Appearance/void | none | none | none | none | none | none |
| Appearance/Unfilled | none | none | none | none | none | none |
| Adhesion state | good | good | good | good | good | good |
| Peeling from substrate | none | none | none | none | partial peeling | partial peeling |
| Heat resistance test | no problem | no problem | no problem | no problem | short circuit | short circuit |
| Moisture resistance test | no problem | no problem | no problem | no problem | no problem | short circuit |

As shown in Table 1, Comparative Examples 1 and 2 demonstrated that when the semiconductor device mounting surface of the substrate having semiconductor devices mounted thereon was collectively encapsulated without the electromagnetic wave shielding support base, the encapsulated substrate having semiconductor devices mounted thereon to be manufactured greatly warped as compared with Examples. Moreover, it was revealed that the semiconductor devices were peeled from the substrate since the warpage was too large. On the other hand, Examples 1 to 4, in which the electromagnetic wave shielding support base-attached encapsulant of the present invention was used, demonstrated that warping of the substrate was greatly inhibited, appearance and adhesion state were excellent, and neither voids nor unfilled portions were generated. Further, the results of the reliability evaluation of the semiconductor apparatus obtained by dicing into each piece revealed that Examples 1 to 4 have no difference, and all of them have excellent heat resistance and moisture resistance.

Besides, a BT resin substrate with a thickness of 100 μm and a size of 240 mm×240 mm having a Cu-microstrip line with an impedance of 50Ω was prepared for measuring electromagnetic wave shielding property. This substrate with the microstrip line was encapsulated instead of a substrate having semiconductor devices mounted thereon in the same manner as in Example 1 and Comparative Example 1. After encapsulation, 250-MHz sine wave was applied to the microstrip line, and the magnetic field strength generated on the package surface was measured by a near magnetic field strength measuring apparatus. While Comparative Example 1 having no electromagnetic wave shielding support base showed −75 dBm, Example 1 showed −105 dBm, and thus electromagnetic wave shielding properties were found.

From these results, it was demonstrated that the electromagnetic wave shielding support base-attached encapsulant of the present invention can suppress the shrinkage stress of the thermosetting resin layer at the time of curing, so that warping of the substrate or the wafer and peeling of the semiconductor devices from the substrate can be inhibited. Thus, it could be clarified that a high-quality semiconductor apparatus having electromagnetic wave shielding property can be obtained.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. An electromagnetic wave shielding support base with attached encapsulant for collectively encapsulating a semiconductor device mounting surface of a substrate having plural semiconductor devices mounted thereon or a semiconductor device forming surface of a wafer having plural semiconductor devices formed thereon, the support base with attached encapsulant comprising:
   a support base having an electromagnetic wave shielding property of 20 dB or more within a range of 100 MHz to 1,000 MHz, and
   an encapsulant composed of a thermosetting resin layer laminated on the support base,
   wherein the thermosetting resin layer of the support base with attached encapsulant covers the semiconductor device mounting surface of the substrate having plural semiconductor devices mounted thereon or the semiconductor device forming surface of the wafer having plural semiconductor devices formed thereon.

2. The electromagnetic wave shielding support base with attached encapsulant according to claim 1, wherein the support base contains a resin having electromagnetic wave shielding property.

3. The electromagnetic wave shielding support base with attached encapsulant according to claim 2, wherein the support base contains a layer composed of a metal.

4. An encapsulated substrate having semiconductor devices mounted thereon, obtained by covering a semiconductor device mounting surface of a substrate having semiconductor devices mounted thereon with the thermosetting resin layer of the electromagnetic wave shielding support base with attached encapsulant according to claim 3, and heating and curing the thermosetting resin layer to collectively encapsulate the semiconductor device mounting surface by the electromagnetic wave shielding support base with attached encapsulant.

5. An encapsulated wafer having semiconductor devices formed thereon, obtained by covering a semiconductor device forming surface of a wafer having semiconductor devices formed thereon with the thermosetting resin layer of the electromagnetic wave shielding support base with attached encapsulant according to claim 3, and heating and curing the thermosetting resin layer to collectively encapsulate the semiconductor device forming surface by the electromagnetic wave shielding support base with attached encapsulant.

6. An encapsulated substrate having semiconductor devices mounted thereon, obtained by covering a semiconductor device mounting surface of a substrate having semiconductor devices mounted thereon with the thermosetting resin layer of the electromagnetic wave shielding support base with attached encapsulant according to claim 2, and heating and curing the thermosetting resin layer to collectively encapsulate the semiconductor device mounting surface by the electromagnetic wave shielding support base with attached encapsulant.

7. An encapsulated wafer having semiconductor devices formed thereon, obtained by covering a semiconductor device forming surface of a wafer having semiconductor devices formed thereon with the thermosetting resin layer of the electromagnetic wave shielding support base with attached encapsulant according to claim 2, and heating and curing the thermosetting resin layer to collectively encapsulate the semiconductor device forming surface by the electromagnetic wave shielding support base with attached encapsulant.

8. The electromagnetic wave shielding support base with attached encapsulant according to claim 1, wherein the support base contains a resin and a fiber base, and either or both of the resin and the fiber base have electromagnetic wave shielding property.

9. The electromagnetic wave shielding support base with attached encapsulant according to claim 8, wherein the support base contains a layer composed of a metal.

10. An encapsulated substrate having semiconductor devices mounted thereon, obtained by covering a semiconductor device mounting surface of a substrate having semiconductor devices mounted thereon with the thermosetting resin layer of the electromagnetic wave shielding support base with attached encapsulant according to claim 9, and heating and curing the thermosetting resin layer to collectively encapsulate the semiconductor device mounting surface by the electromagnetic wave shielding support base with attached encapsulant.

11. An encapsulated wafer having semiconductor devices formed thereon, obtained by covering a semiconductor device forming surface of a wafer having semiconductor devices formed thereon with the thermosetting resin layer of the electromaanetic wave shielding support base with attached encapsulant according to claim 9, and heating and curing the thermosetting resin layer to collectively encapsulate the semiconductor device forming surface by the electromagnetic wave shielding support base with attached encapsulant.

12. An encapsulated substrate having semiconductor devices mounted thereon, obtained by covering a semiconductor device mounting surface of a substrate having semiconductor devices mounted thereon with the thermosetting resin layer of the electromagnetic wave shielding support base with attached encapsulant according to claim 8, and heating and curing the thermosetting resin layer to collectively encapsulate the semiconductor device mounting surface by the electromagnetic wave shielding support base with attached encapsulant.

13. An encapsulated wafer having semiconductor devices formed thereon, obtained by covering a semiconductor device forming surface of a wafer having semiconductor devices formed thereon with the thermosetting resin layer of the electromagnetic wave shielding support base with attached encapsulant according to claim 8, and heating and curing the thermosetting resin layer to collectively encapsulate the semiconductor device forming surface by the electromagnetic wave shielding support base with attached encapsulant.

14. The electromagnetic wave shielding support with attached encapsulant according to claim 1, wherein the support base contains a layer composed of a metal.

15. An encapsulated substrate having semiconductor devices mounted thereon, obtained by covering a semiconductor device mounting surface of a substrate having semiconductor devices mounted thereon with the thermosetting resin layer of the electromagnetic wave shielding support base with attached encapsulant according to claim 14, and heating and curing the thermosetting resin layer to collectively encapsulate the semiconductor device mounting surface by the electromagnetic wave shielding support base with attached encapsulant.

16. An encapsulated wafer having semiconductor devices formed thereon, obtained by covering a semiconductor device forming surface of a wafer having semiconductor devices formed thereon with the thermosetting resin layer of the electromagnetic wave shielding support base with attached encapsulant according to claim 14, and heating and curing the thermosetting resin layer to collectively encapsulate the semiconductor device forming surface by the electromagnetic wave shielding support base with attached encapsulant.

17. An encapsulated substrate having semiconductor devices mounted thereon, obtained by covering a semiconductor device mounting surface of a substrate having semiconductor devices mounted thereon with the thermosetting resin layer of the electromagnetic wave shielding support base with attached encapsulant according to claim 1, and heating and curing the thermosetting resin layer to collectively encapsulate the semiconductor device mounting surface by the electromagnetic wave shielding support base with attached encapsulant.

18. A semiconductor apparatus obtained by dicing the encapsulated substrate having semiconductor devices mounted thereon according to claim 17 into each piece.

19. An encapsulated wafer having semiconductor devices formed thereon, obtained by covering a semiconductor device forming surface of a wafer having semiconductor devices formed thereon with the thermosetting resin layer of the electromagnetic wave shielding support base with attached encapsulant according to claim 1, and heating and curing the thermosetting resin layer to collectively encapsulate the semiconductor device forming surface by the electromagnetic wave shielding support base with attached encapsulant.

20. A semiconductor apparatus obtained by dicing the encapsulated wafer having semiconductor devices formed thereon according to claim 19 into each piece.

* * * * *